United States Patent
Hiester et al.

(10) Patent No.: US 11,512,393 B2
(45) Date of Patent: Nov. 29, 2022

(54) DYNAMIC SHEATH CONTROL WITH EDGE RING LIFT

(71) Applicant: Lam Research Corporation, Fremont, CA (US)

(72) Inventors: Jacob Lee Hiester, Newberg, OR (US); Richard M. Blank, San Jose, CA (US); Curtis W. Bailey, West Linn, OR (US); Michael J. Janicki, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 60 days.

(21) Appl. No.: 16/205,028

(22) Filed: Nov. 29, 2018

(65) Prior Publication Data
US 2020/0173018 A1 Jun. 4, 2020

(51) Int. Cl.
*C23C 16/458* (2006.01)
*C23C 16/455* (2006.01)

(52) U.S. Cl.
CPC .... *C23C 16/4583* (2013.01); *C23C 16/45544* (2013.01)

(58) Field of Classification Search
CPC .......... C23C 16/4583; C23C 16/45544; C23C 16/4581; C23C 16/4585; C23C 16/50;
(Continued)

(56) References Cited

U.S. PATENT DOCUMENTS 6,120,609 A * 9/2000 Selyutin .............. C23C 16/4583
118/500
7,176,403 B2 * 2/2007 Steger ............... H01J 37/32623
219/121.43
(Continued)

FOREIGN PATENT DOCUMENTS

KR 10-2008-0023569 * 3/2008 ......... H01L 21/3065
KR 10-2008-0023569 A 3/2008
KR 10-2011-0080811 A 7/2011

OTHER PUBLICATIONS

Intl Search Report and Written Opinion PCT/US2019/061458, dated Sep. 3, 2020, 14 pages.
(Continued)

*Primary Examiner* — Ram N Kackar
(74) *Attorney, Agent, or Firm* — Penilla IP, APC

(57) ABSTRACT

A pedestal assembly including a pedestal for supporting a substrate. A central shaft positions the pedestal at a height during operation. A ring is placed along a periphery of the pedestal. A ring adjuster subassembly includes an adjuster flange disposed around a middle section of the central shaft. The subassembly includes a sleeve connected to the adjuster flange and extending from the adjuster flange to an adjuster plate disposed under the pedestal. The subassembly includes ring adjuster pins connected to the adjuster plate and extending vertically from the adjuster plate. Each of the ring adjuster pins being positioned on the adjuster plate at locations adjacent to and outside of a pedestal diameter. The ring adjuster pins contacting an edge undersurface of the ring. The adjuster flange coupled to at least three adjuster actuators for defining an elevation and tilt of the ring relative to a top surface of the pedestal.

20 Claims, 19 Drawing Sheets

(58) Field of Classification Search
CPC . C23C 16/52; C23C 16/505; H01L 21/68735; H01L 21/68742; H01L 21/68785; H01L 21/68792; H01J 37/32082; H01J 37/32642; H01J 37/32715; H01J 2237/3321
USPC ..................................... 156/345.51; 118/728
See application file for complete search history.

(56) References Cited

U.S. PATENT DOCUMENTS

| | | |
|---|---|---|
| 2004/0149389 A1* | 8/2004 | Fink .................. H01J 37/32642 156/345.51 |
| 2017/0121819 A1* | 5/2017 | Swaminathan ..... H01J 37/3299 |
| 2017/0213758 A1* | 7/2017 | Rice .................. H01L 21/67017 |
| 2017/0263478 A1* | 9/2017 | McChesney ...... H01J 37/32623 |
| 2018/0130696 A1 | 5/2018 | Konkola et al. |
| 2018/0138074 A1 | 5/2018 | Lee et al. |

OTHER PUBLICATIONS

Intl Prelim Report and Written Opinion PCT/US2019/061458, dated Jun. 10, 2021, 13 pages.

* cited by examiner

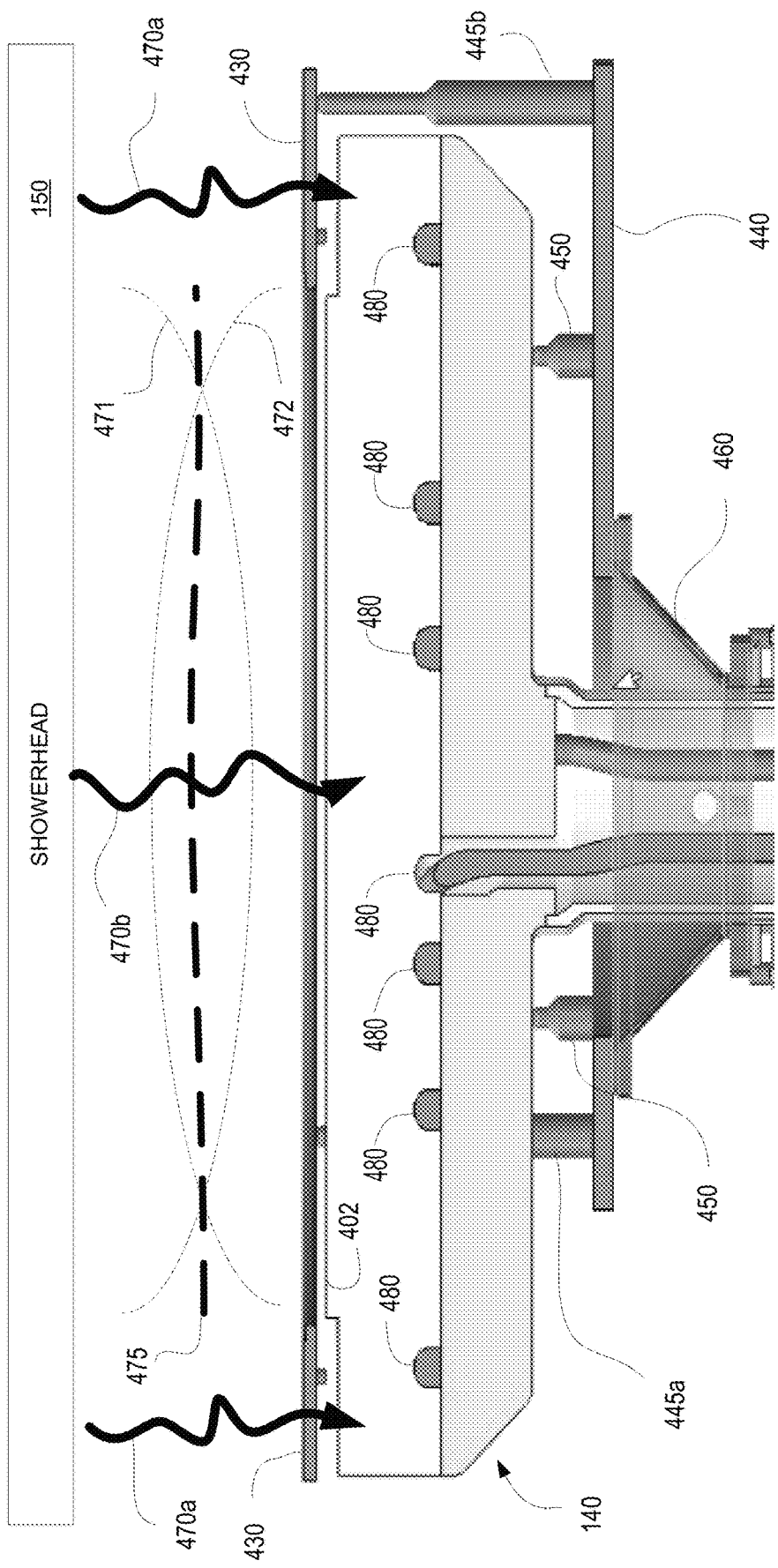

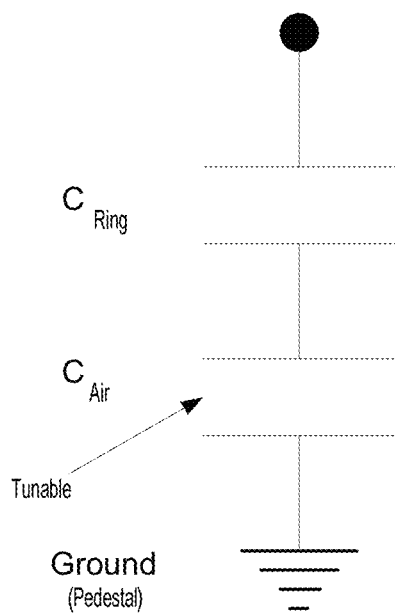 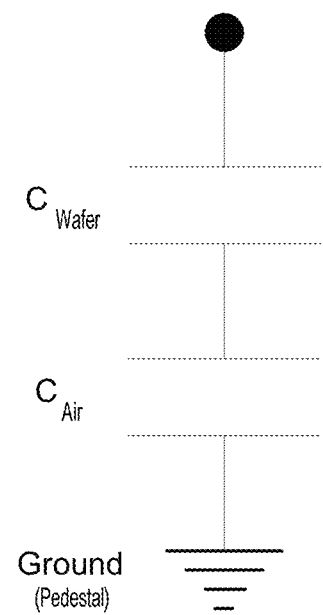
FIG. 4C-1            FIG. 4C-2

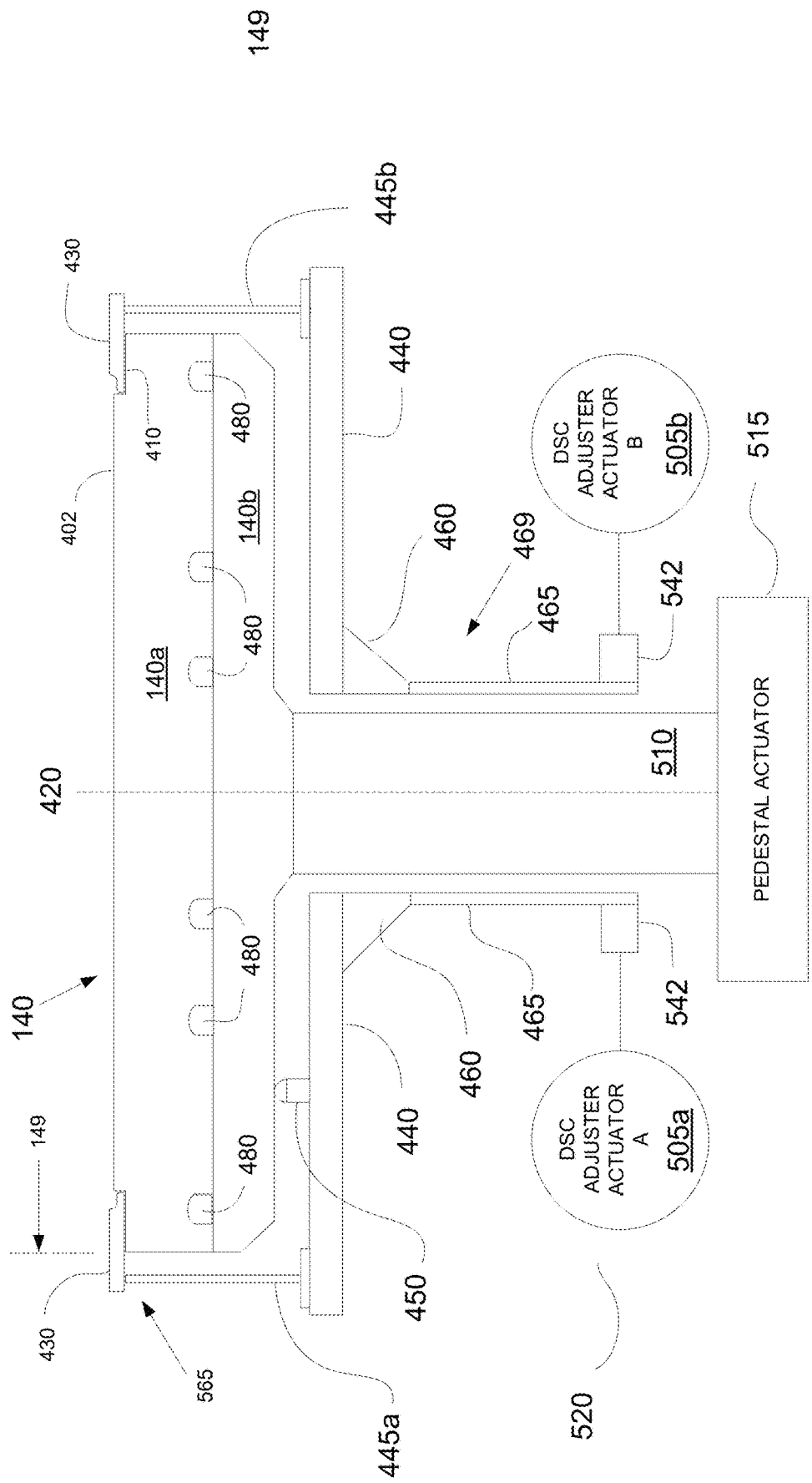

DYNAMIC SHEATH CONTROL WITH EDGE RING LIFT

TECHNICAL FIELD

The present embodiments relate to semiconductor substrate processing equipment tools, and more particularly, a dynamic sheath control configured for edge ring lift.

BACKGROUND OF THE DISCLOSURE

Improved film uniformity is important in plasma-enhanced chemical vapor deposition (PECVD) and plasma atomic layer deposition (ALD) technologies. The chamber systems implementing PECVD and ALD processes may introduce nonuniformities of various origins. In particular, multi-station modules performing PECVD and ALD feature a large, open reactor that may contribute to azimuthal nonuniformities and edge drop effects. Nonuniformities also exist in single station modules. For example, a standard pedestal configuration does not provide the desired flow profile and/or material conditions near the edge of the wafer during plasma processing. The result of the current configuration using PECVD hardware near the wafer may result in a lower or higher edge deposition profile depending on the recipe conditions. As dies are pushed ever closer to the wafer edge, the numerical contribution of this azimuthal nonuniformity to overall nonuniformity grows. Despite best efforts to minimize damage and/or non-uniform deposition profiles, traditional PECVD and plasma ALD schemes still need improvement.

In particular, a standard pedestal configuration does not provide the desired flow profile and/or material conditions near the edge of the wafer during plasma processing. The result of the current configuration using PECVD hardware near the wafer may result in a lower edge deposition profile. Furthermore, uniformity degrades over time, primarily at wafer edge, where it is most sensitive to the flow profile and local conditions, creating the need to maintain a stable edge condition at all times.

Further, a single carrier/focus ring will not fit a wide array of deposition films. Even if optimal edge profiles could be created for different combinations of carrier/focus rings and wafers, replacing carrier/focus rings is not feasible in an automated fashion due to other constraints on the platform side (slot valves, load-locks, etc.). Also, manually replacing carriers based on film type is not feasible since it will not retain product up time (chamber cooling, open, replace, close, re-qualify).

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to solving one or more problems found in the related art, and specifically to perform semiconductor processes including the tuning of deposition profile near the edge of a wafer by lifting and/or lowering an edge ring of a PECVD deposition pedestal to modulate the relative capacitance that the RF field sees between the wafer or through the edge ring. Several inventive embodiments of the present disclosure are described below.

Deposition chambers (e.g., PECVD, ALD, etc.) contain one or more stations with an radio frequency (RF) source, a wafer, and a grounded surface opposing the source. Edge (e.g., focus or carrier) rings are used to shape the deposition profile near the edge of wafer disposed on a pedestal within a station. In embodiments of the present disclosure, dynamic sheath control (DSC) provides for lifting of the edge of the edge (e.g., focus/carrier) ring on a deposition pedestal to modulate the relative capacitance that the RF field sees in flow paths through the wafer and through the edge ring.

Embodiments of the present disclosure include a pedestal assembly of a process chamber for depositing a film on a wafer. The pedestal assembly including a pedestal for supporting a substrate. The pedestal having a central shaft that positions the pedestal at a height during operation. The pedestal assembly including a ring configured for placement along a periphery of the pedestal. The pedestal assembly including a ring adjuster subassembly. The ring adjuster subassembly including an adjuster flange disposed around a middle section of the central shaft. The ring adjuster subassembly including a sleeve connected to the adjuster flange and extending from the adjuster flange to an adjuster plate disposed under the pedestal. The ring adjuster subassembly including a plurality of ring adjuster pins connected to the adjuster plate and extending vertically from the adjuster plate. Each of the plurality of ring adjuster pins at a corresponding location on the adjuster plate that is adjacent to and outside of a diameter of the pedestal. The plurality of ring adjuster pins configured for contacting an edge undersurface of the ring. The adjuster flange being coupled to at least three adjuster actuators for defining an elevation and tilt of the ring relative to a top surface of the pedestal.

Other embodiments of the present disclosure include another pedestal assembly of a process chamber for depositing a film on a wafer. The pedestal assembly including a pedestal for supporting a substrate. The pedestal having a central shaft that positions the pedestal at a height during operation. The pedestal assembly including a ring configured for placement along a periphery of the pedestal. The pedestal assembly including a ring adjuster subassembly. The ring adjuster subassembly including a lower flange disposed around a lower section of the central shaft, and configured to maintain a vacuum within the central shaft. The ring adjuster subassembly including a lower bellows connected to the lower flange. The ring adjuster subassembly including an adjuster flange connected to the lower bellows and disposed around a middle section of the central shaft. The ring adjuster subassembly including a sleeve connected to the adjuster flange and extending from the adjuster flange to an adjuster plate disposed under the pedestal. The ring adjuster subassembly including an upper bellows connected to the adjuster flange. The ring adjuster subassembly including an upper flange connected to the upper bellows. The ring adjuster subassembly including a plurality of ring adjuster pins connected to the adjuster plate and extending vertically from the adjuster plate. Each of the plurality of ring adjuster pins at a corresponding location on the adjuster plate that is adjacent to and outside of a diameter of the pedestal. The plurality of ring adjuster pins configured for contacting an edge undersurface of the ring. The adjuster flange being coupled to at least three adjuster actuators for defining an elevation and tilt of the ring relative to a top surface of the pedestal.

Still other embodiments of the present disclosure include another pedestal assembly of a process chamber for depositing a film on a wafer. The pedestal assembly including a pedestal for supporting a substrate. The pedestal having a central shaft that positions the pedestal at a height during operation. The pedestal assembly including a ring configured for placement along a periphery of the pedestal and extending beyond an outer diameter of the pedestal at a plurality of arms. The pedestal assembly including a ring adjuster subassembly. The ring adjuster subassembly including an adjuster flange disposed around a middle section of the central shaft. The ring adjuster subassembly including a sleeve connected to the adjuster flange and extending from the adjuster flange to an adjuster plate disposed under the pedestal. The sleeve configured for independent vertical movement relative to the central shaft at a plurality of contact points, the plurality of contact points aligned with the plurality of arms. The ring adjuster subassembly including a plurality of ring adjuster pins connected to the adjuster plate and extending vertically from the adjuster plate. Each of the plurality of ring adjuster pins at a corresponding location on a corresponding arm of the adjuster plate that is adjacent to and outside of a diameter of the pedestal. The plurality of ring adjuster pins configured for contacting an edge undersurface of the ring. The adjuster flange being coupled to at least three adjuster actuators in alignment with the plurality of contact points for defining an elevation and tilt of the ring relative to a top surface of the pedestal.

Other embodiments of the present disclosure include a process chamber for depositing a film on a wafer. The process chamber includes a pedestal configured to receive the wafer. The pedestal includes a central top surface extending from a central axis of the pedestal to a central top surface diameter. The pedestal includes an annular surface extending from the central top surface diameter to an outer diameter of the annular surface. The annular surface being at a step down from the central top surface. The pedestal includes a central shaft extending from the central axis of the pedestal to shaft diameter corresponding to an outer shaft surface. The central shaft being configured for vertical movement which is translated to the pedestal. The process chamber includes an edge ring positioned adjacent to the annular surface and extending from an inner diameter to beyond the outer diameter of the annular surface at a plurality of radial extensions of the edge ring. The process chamber includes an outer sheath adjacent to the outer shaft surface. The outer sheath is configured for independent vertical movement relative to the central shaft at a plurality of contact points of the outer sheath. The plurality of contact points corresponding to the plurality of radial extensions of the edge ring. The process chamber includes a funnel connected to the outer sheath. The process chamber includes a DSC (dynamic sheath control) lift pin plate connected to the funnel. The DSC lift pin plate having a plurality of arms corresponding to the plurality of contact points of the outer sheath. The process chamber includes a plurality of DSC lift pins connected to the DSC lift pin plate at the ends of the plurality of arms. The plurality of DSC lift pins being configured to contact the plurality of radial extensions of the edge ring. The independent vertical movement of the outer sheath is translated to one or more DSC lift pins through the funnel and one or more arms of the DSC lift pin plate.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 4C illustrates a cutaway view showing the relative capacitances seen near the edge of a wafer placed on a pedestal between flow paths through the wafer disposed thereon or through an edge ring, in accordance with one embodiment of the present disclosure.

FIG. 4C-1 illustrates the total capacitance of a flow path through an edge ring to the pedestal, in accordance with one embodiment of the present disclosure.

FIG. 4C-2 illustrates the total capacitance of a flow path through a wafer to the pedestal, in accordance with one embodiment of the present disclosure.

FIG. 5C illustrates a cross-section taken along line X-X of FIG. 5A or 5B of a pedestal configuration including dynamic sheath control to lift radial portions of the carrier ring to modulate the relative capacitances of RF flow paths through a wafer or a carrier ring, in accordance with one embodiment of the present disclosure.

FIG. 5D-1 illustrates dimensions of a carrier/focus ring configured for tuning the relative capacitances of RF flow paths through a wafer or the carrier/focus ring, wherein the carrier/focus ring is resting on an annular surface, in accordance with one embodiment of the present disclosure.

FIG. 5D-2 illustrates dimensions of the carrier/focus ring of FIG. 5D-1 that is configured for tuning the relative capacitances of RF flow paths through a wafer or the carrier/focus ring, wherein the carrier/focus ring is raised from the annular surface, in accordance with one embodiment of the present disclosure.

FIG. 5D-3 illustrates dimensions of a thin carrier/focus ring configured for tuning the relative capacitances of RF flow paths through a wafer or the carrier/focus ring, wherein the carrier/focus ring is resting on an annular surface, in accordance with one embodiment of the present disclosure.

FIG. 5D-4 illustrates dimensions of the thin carrier/focus ring of FIG. 5D-3 that is configured for tuning the relative capacitances of RF flow paths through a wafer or the carrier/focus ring, wherein the carrier/focus ring is raised from the annular surface, in accordance with one embodiment of the present disclosure.

DETAILED DESCRIPTION

Figure 1:
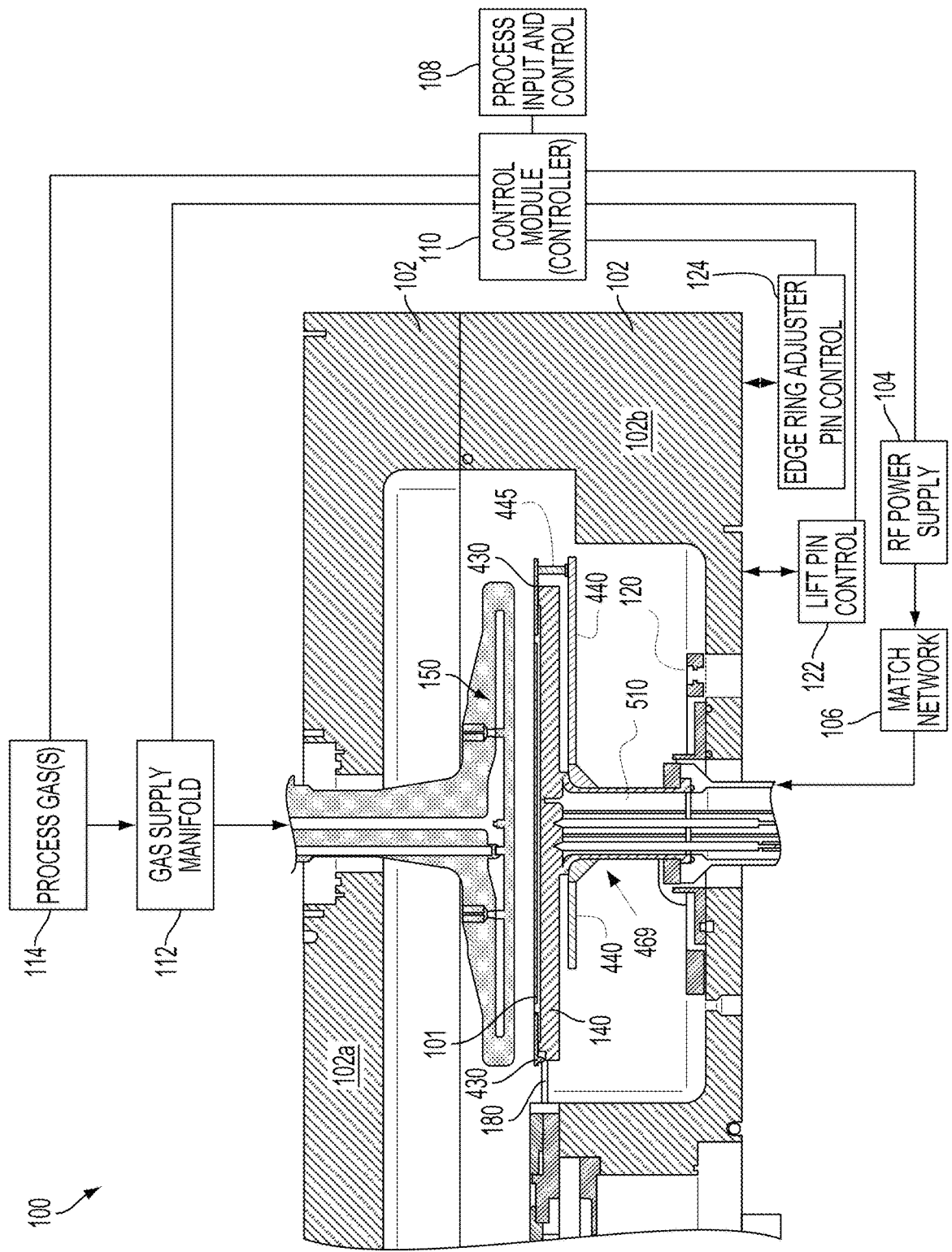
FIG. 1 illustrates a substrate processing system, which is used to process a wafer, e.g., to form films thereon.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe systems that provide for improved film uniformity during wafer processing (e.g., PECVD and ALD processes) in single-station and multi-stations systems. In particular, various embodiments of the present disclosure describe pedestal assemblies that provide for modulation of the relative capacitances of flow paths that the RF field sees at the edge of a wafer during deposition processes. For example, at the edge of the wafer one flow path is through the wafer, and a second flow path is through the edge ring. In particular, the edge ring is lifted at one or more points to provide for lift and/or tilt of the edge ring with respect to the pedestal in order to alter the deposition profile at the edge of the wafer. Recipe controlled tuning of the edge profile performed by tuning the relative capacitances at one or more points along the outer edge of the wafer may be made based on particular recipes or film properties.

Advantages of the various embodiments, disclosing pedestal assemblies configured for dynamic sheath control to lift radial portions of an edge (e.g., carrier or focus) ring, include the tuning or modulation of the relative capacitances of RF flow paths through a wafer or the edge ring to obtain favorable deposition profiles near the edge of the wafer thereby extending the available area of the wafer suitable for generating dies and increasing the number of dies per wafer. That is, embodiments of the present disclosure provide for recipe controlled tuning of the edge profile of a wafer, whereas current deposition hardware technologies are not configured for recipe controlled turning of the edge profile. Other advantages of the various embodiments, disclosing pedestal assemblies configured for dynamic sheath control to lift radial portions of an edge (e.g., carrier or focus) ring, include a retrofittable solution that does not require chamber modifications, which otherwise would be costly, untimely, and not even feasible at some customer sites. In some embodiments, pressure actuated tuning capitalizes on space which was not being used when retrofitting, provides micro actuation at a much lower cost (no motors, few electronic controls, etc.), and at finer resolutions for tuning (e.g., <1 mm travel ranges). In other embodiments, motor actuated (e.g., motors with ball screws) tuning provides for a retrofittable solution that also provide micro actuation at finer resolutions for tuning (e.g., >5 mm travel ranges).

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

FIG. 1 illustrates a reactor system 100, which may be used to deposit films over substrates, such as those formed in PECVD or ALD processes. These reactors may utilize two or more heaters, and the common terminal configurations may be used in this example reactor to control the temperatures for uniformity or custom settings. More particularly, FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

The center column (e.g., also known as central shaft) also includes lift pins (not shown), each of which is actuated by a corresponding lift pin actuation ring 120 as controlled by lift pin control 122. The lift pins are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flowed into the shower head 150 and distributed in a space volume defined between the showerhead 150 face that faces that wafer 101 and the wafer 101 resting over the pedestal 140. In ALD processes, the gases can be reactants chosen for absorption or reaction with absorbed reactants.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is an edge ring 430 (e.g., carrier ring, focus ring, etc.) that encircles an outer and/or peripheral region of the pedestal 140. The edge ring 430 is configured to shape the deposition profile near the edge of the wafer 101. The edge ring 430 is configured to sit over an annular ring support region that is a step down from a wafer support region in the center of the pedestal 140. The edge ring 430 includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the edge ring 430 (e.g., carrier ring) is lifted by spider forks 180. The edge ring 430 (e.g., carrier ring) is therefore lifted along with the wafer 101 and can be rotated to another station, e.g., in a multi-station system. In other embodiments, the chamber is a single station chamber.

Also shown is a ring adjuster subassembly that includes an adjuster flange (not shown), a sleeve 469, and a plurality of ring adjuster pins 445. The adjuster pins 445 are connected to a ring adjuster plate 440. One or more adjuster actuators (not shown) as controlled by an edge ring adjuster pin control 124 actuate vertical movement of the ring adjuster subassembly and correspondingly the adjuster pins 445. The adjuster pins 445 are used to raise and lower radial portions of the edge ring 430 to modulate the relative capacitances of RF flow paths through a wafer or the edge ring. In that manner, the deposition profiles near the edge of the wafer may be tuned by tuning the relative capacitances of flow paths at the edge. Favorable edge profiles may be achieved depending on the particular recipes or film properties of the wafer (e.g., varying between customer wafer types), which significantly affects deposition edge profiles. As such, radial uniformity of deposition profiles especially near the edge of the wafer may be achieved.

Figure 2:
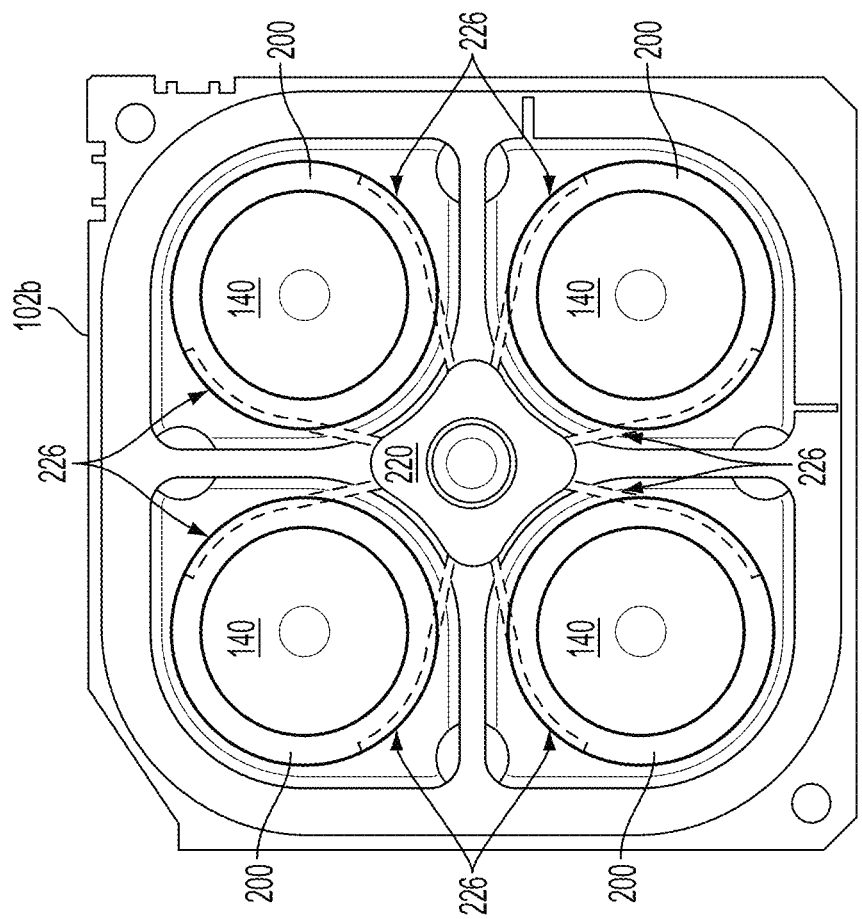
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber portion 102*b* (e.g., with the top chamber portion 102*a* removed for illustration), wherein four stations are accessed by spider forks 226. Each spider fork, or fork includes a first and second arm, each of which is positioned around a portion of each side of the pedestal 140. In this view, the spider forks 226 are drawn in dashlines, to convey that they are below the edge ring 430 (e.g., carrier ring, focus ring, etc.). The spider forks 226, using an engagement and rotation mechanism 220 are configured to raise up and lift the edge rings 430 (i.e., from a lower surface of the edge rings 430) from the stations simultaneously, and then rotate at least one or more stations before lowering the edge rings 430 (where at least one of the edge rings supports a wafer 101) to a next location so that further plasma processing, treatment and/or film deposition can take place on respective wafers 101.

Figure 3:
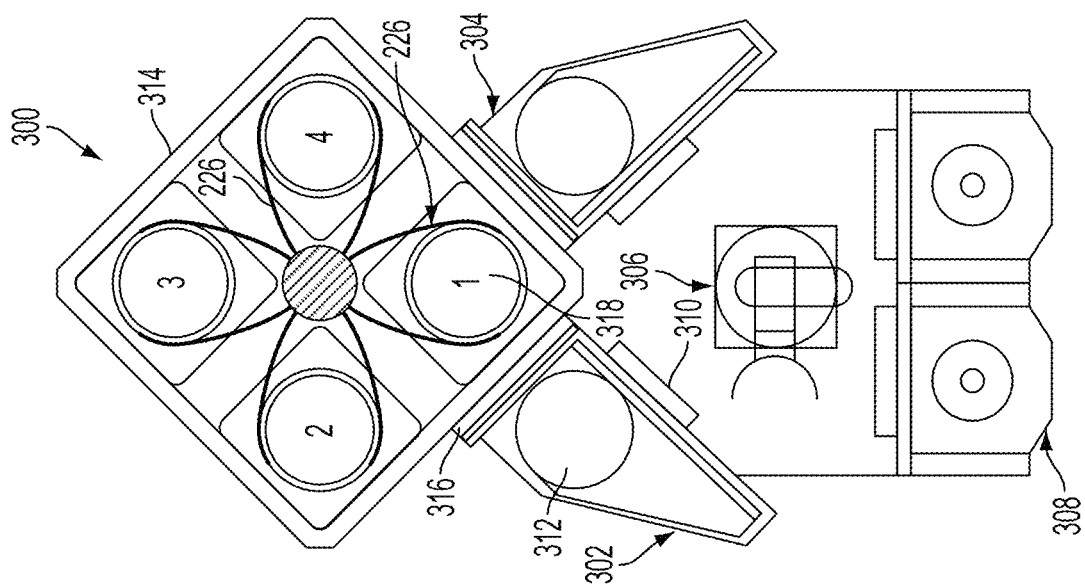
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102*b*. Thus, when chamber transport 316 is opened, another robot (not shown) may move the substrate from inbound load lock 302 to a pedestal 140 of a first process station for processing.

The depicted processing chamber 102 comprises four process stations, numbered from 1 to 4 in the embodiment shown in FIG. 3. In some embodiments, processing chamber chamber 102 may be configured to maintain a low pressure environment so that substrates may be transferred using an edge ring 430 (e.g., carrier ring 430A) among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within processing chamber 102*b*. The spider forks 226 rotate and enable transfer of wafers from one station to another. The transfer occurs by enabling the spider forks 226 to lift edge rings 430 (e.g., carrier rings 430A) from an outer undersurface, which lifts the wafer, and rotates the wafer and carrier together to the next station. In one configuration, the spider forks 226 are made from a ceramic material to withstand high levels of heat during processing.

Figure 4A:
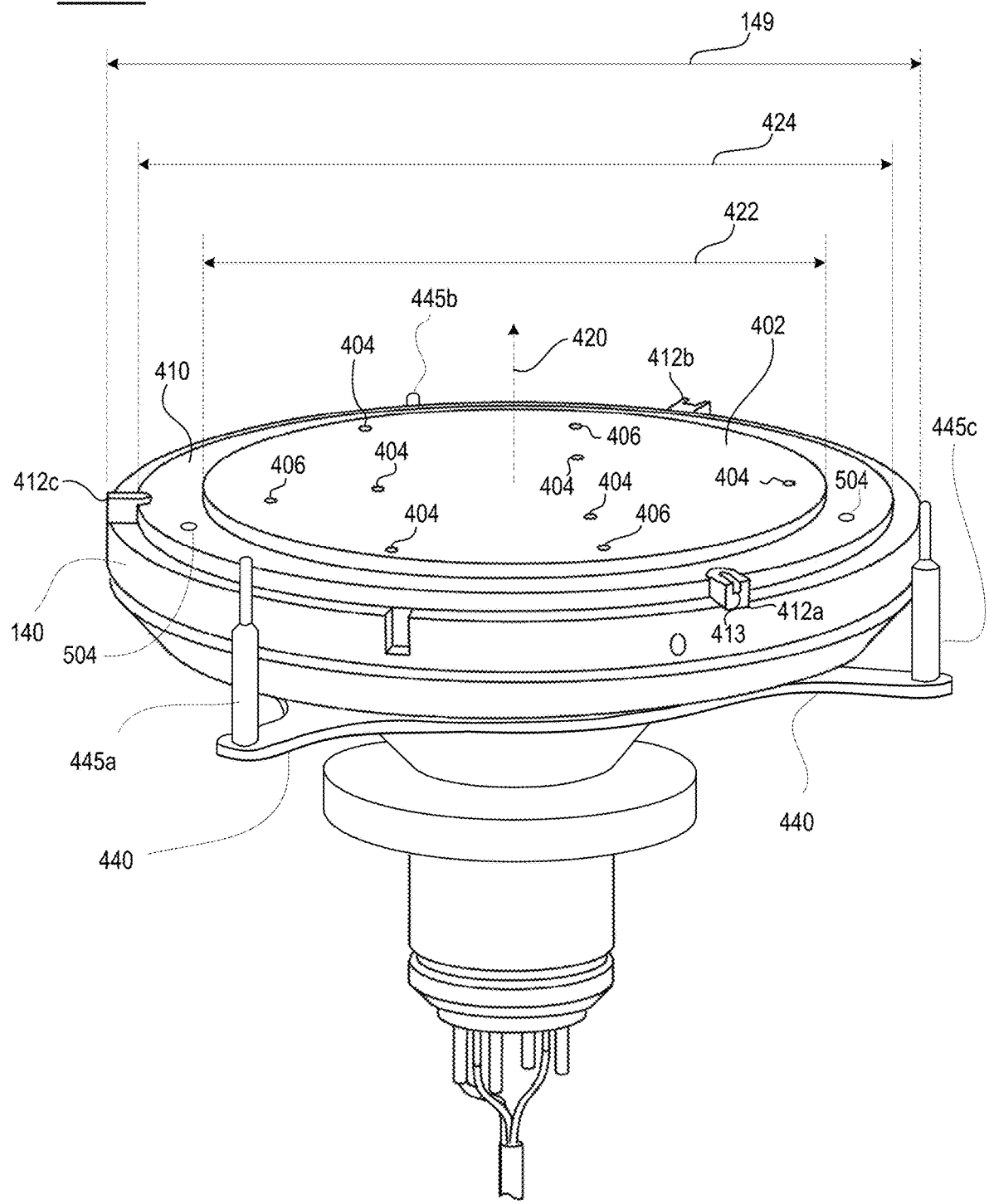
FIG. 4A illustrates a pedestal that is configured to receive a wafer for a deposition process, such as a PECVD or atomic layer deposition (ALD) process, wherein the pedestal configuration includes a dynamic sheath control (DSC) system configured for tuning the relative capacitances seen near the edge of the wafer between flow paths through the wafer or through an edge ring, in accordance with one embodiment of the present disclosure.

FIG. 4A illustrates a pedestal assembly 400A that is configured to receive a wafer for a deposition process, such as a PECVD or ALD process. The pedestal assembly includes a central top surface 402 that is defined by a circular area extending from a central axis 420 of the pedestal to a top surface diameter 422 that defines the edge of the central top surface 402. The central top surface 402 includes a plurality of wafer supports 404, which are defined on the central top surface 402 and configured to support the wafer at a support level above the central top surface. The wafer support level is defined by the vertical position of the bottom surface of a wafer when seated on the wafer supports. Additionally shown are recesses 406, which are configured to house lift pins. As noted above, the lift pins can be utilized to raise the wafer from the wafer supports to allow for engagement by an end-effector.

In some embodiments, each wafer support defines a minimum contact area (MCA). MCAs are used to improve precision mating between surfaces when high precision or tolerances are required, and/or minimal physical contact is desirable to reduce defect risk. Other areas in the system can utilize MCA's, such as over the edge ring supports, over an annular ring supporting an edge ring, and over the inner wafer support region of the edge ring, as described in further detail below.

The pedestal assembly 400A further includes an annular surface 410 extending from the top surface diameter 422 of the pedestal (which is at the outer edge of the central top surface 402) to an outer diameter 424 of the annular surface. The annular surface 410 defines an annular region surrounding the central top surface 402, but at a step down from the central top surface. That is, the vertical position of the annular surface 410 is lower than the vertical position of the central top surface 402.

A plurality of edge ring supports 412a, 412b, and 412c are positioned substantially at/along the edge (outer diameter) of the annular surface 410 and symmetrically distributed about the annular surface. The edge ring supports can in some embodiments define MCA's 504 for supporting a corresponding edge ring. MCAs 504 may be located in one or more locations on the annular surface 410. In some implementations, the edge ring supports 412a, 412b, and 412c extend beyond the outer diameter 424 of the annular surface whereas in other implementations they do not. In some implementations, the top surfaces of the edge ring supports have a height that is slightly higher than that of the annular surface 410, so that when an edge ring is resting on the edge ring supports, then the edge ring is supported at a predefined distance above the annular surface 410. Each edge ring support may include a recess, such as recess 413 of edge ring support 412a, in which an extension protruding from the underside of the edge ring is seated when the edge ring is supported by the edge ring supports. The mating of the edge ring extensions to the recesses in the edge ring supports provides for secure positioning of the edge ring and prevents the edge ring from moving when seated on the edge ring supports.

In some implementations, the top surfaces of the edge ring supports 412 are flush with the annular surface 410, or in other implementations, there are no edge ring supports separately defined from the annular surface, so that the edge ring may rest directly on the annular surface. The result is that no gap exists between the edge ring and the annular surface 410. In such implementations, the pathway between the edge ring and the annular surface 410 is closed, preventing precursors from accessing the wafer backside via this pathway.

In the illustrated embodiment, there are three edge ring supports 412a, 412b, and 412c positioned symmetrically along the outer edge region of the annular surface. However, in other implementations, there may be three or more edge ring supports, distributed at any locations along the annular surface 410 of the pedestal assembly 400A, to support an edge ring in a stable resting configuration.

It will be appreciated that when the wafer is supported by the wafer supports and the edge ring is supported by the edge ring supports, then an edge region of the wafer is disposed over an inner portion of the edge ring in some embodiments. Generally speaking, the edge region of the wafer extends from an outer edge of the wafer inward by about two to five millimeters (mm). A vertical separation is thereby defined between the edge region of the wafer and the inner portion of the edge ring.

It will be appreciated that the support of the edge ring at the distance above the annular surface 410, as well as the separation between the edge region of the wafer and the inner portion of the edge ring, is tuned so as to limit deposition on a backside of the wafer in the edge region of the wafer (e.g., minimize plasma formation in the gap below the edge of the wafer and above that annular surface 410) and/or for recipe controlled tuning of the edge profile performed by tuning the relative capacitances between RF flow paths at one or more points along the outer edge of the wafer, in accordance with embodiments of the present disclosure. In particular, a ring adjuster assembly is configured for lifting the edge ring at one or more points (e.g., radial points) along a periphery of the edge ring.

In embodiments, the edge ring is lifted at one point (e.g., to provide radial uniformity improvement) and/or three or more points (e.g., to provide radial and azimuthal uniformity improvement) in order to alter the deposition profile and tune based on particular recipes or film properties. Lifting at a single point allows for vertical adjustment. Lifting at three points allows for vertical adjustment and rotation about two horizontal plane axis (e.g., to provide tilt). Lifting at more than three points allows for vertical adjustment and rotation about multiple horizontal plane axis (e.g., to provide tilt). As such, the ring adjuster assembly is configured to provide elevation and tilt of the edge ring relative to the central top surface 402 of the pedestal 140. In embodiments, the range of motion for the edge ring is less than 0.5 millimeters (mm). In other embodiments, the range of motion for the edge ring is less than 1.0 mm. In still other embodiments, the range of motion for the edge ring is less than 5.0 mm. In still other embodiments, the range of motion for the edge ring is less than 10.0 mm.

The ring adjuster assembly includes at least an adjuster plate 440 and a plurality of ring adjuster pins 445. In particular, the plurality of ring adjuster pins 445 is connected to the adjuster plate 440, and the adjuster pins 445 extend extending vertically from the adjuster plate 440. Each of the ring adjuster pins 445 is positioned at a corresponding location on the adjuster plate 440 that is adjacent to and outside of a diameter 149 of the pedestal 140. More particularly, the plurality of ring adjuster pins 445 is configured for contacting an edge undersurface of the edge ring (not shown). As shown, the plurality of ring adjuster pins 445 includes three ring adjuster pins 445a, 445b, and 445c spaced radially equidistant from each other about a horizontal plane. Each of the ring adjuster pins is independently movable in a vertical direction, and when contacting the edge ring define an elevation and tilt of the edge ring relative to a top surface (e.g., central top surface 402) of the pedestal. Actuation of the plurality of ring adjuster pins 445 is further described in relation to FIGS. 5A-5C, 6A, and 7A below.

Figure 4B:
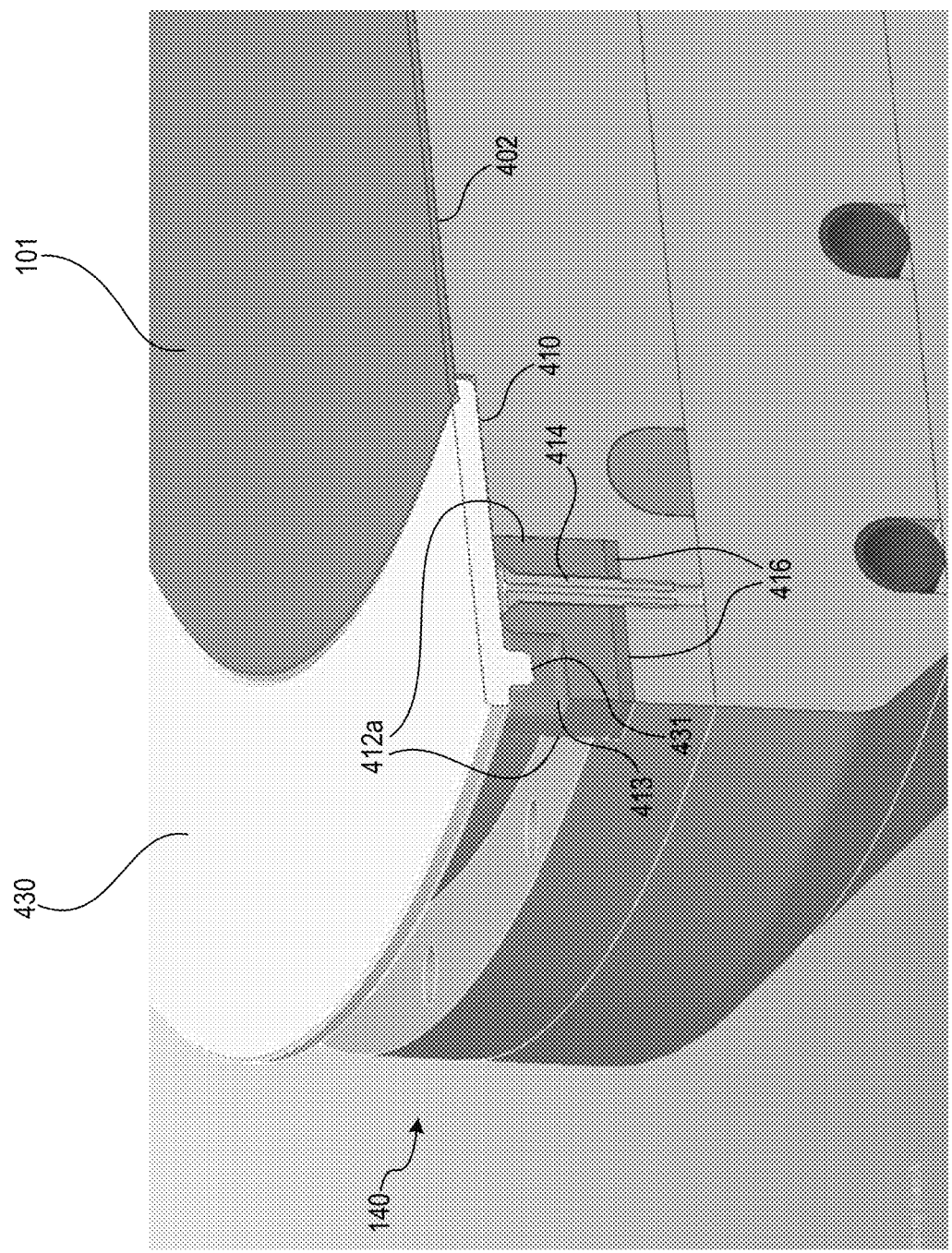
FIG. 4B illustrates a perspective cutaway view of a portion of the pedestal of FIG. 4A showing the mating between an edge ring and the pedestal, in accordance with one embodiment of the present disclosure.

FIG. 4B illustrates a perspective cutaway view of a portion of the pedestal 140 of the pedestal assembly 400A, in accordance with an embodiment of the invention. The cutaway view is a longitudinal section intersecting one of the edge ring supports, e.g. edge ring support 412a. An edge ring 430 is shown resting atop the edge ring support 412a. In this configuration, the edge ring extension 431 is seated within the recess 413 of the edge ring support 412a. Also, a wafer 101 is shown resting over the central top surface 402 of the pedestal (supported by wafer supports—not shown). The edge ring support 412a is height adjustable, so as to allow the distance above the annular surface 410 at which the edge ring is supported to be adjusted. In some implementations, the edge ring supports may define MCAs, or separately MCAs 504 may be located on the annular surface 410 instead of using edge ring supports 412. In some implementations, the edge ring support 412a includes a spacer (e.g. a shim) 416 for adjusting the height of the at least one of the edge ring supports. That is, the spacer 416 is selected to provide for a controlled distance between the edge ring 430 and the annular surface 410 when the edge ring is resting on the carrier ring supports 412. In addition, as will be further described below, the positioning of the edge ring (e.g., vertical placement and tilt) with respect to the central top surface 402 of the pedestal 140 may be tuned for recipe controlled tuning of the edge deposition profile of the wafer performed by tuning the relative capacitances between RF flow paths at one or more points along the outer edge of the wafer.

Additionally, the edge ring support 412a and the spacer(s) 416 are secured to the pedestal by fastening hardware 414. In some implementations, the hardware 414 can be a screw, bolt, nail, pin, or any other type of hardware suitable for securing the edge ring support 412 and spacer(s) 416 to the pedestal 140. In other implementations, other techniques/materials for securing the edge ring support 412 and spacers 416 to the pedestal 140 can be utilized, such as a suitable adhesive.

FIG. 4C illustrates a cutaway view showing the relative capacitances of flow paths seen near the edge of a wafer (not shown) disposed on a pedestal 140, in accordance with one embodiment of the present disclosure. As shown, the pedestal assembly 400C includes at least a pedestal 140 configured for supporting a substrate (e.g., wafer) (not shown). The pedestal 140 may include one or more heating and/or cooling channels 480 configured for temperature control of the pedestal. The pedestal assembly 400C includes a ring or edge ring (e.g., carrier ring, focus ring, etc.) that is configured for placement along a periphery of the pedestal. As shown in the pedestal assembly 400C, an edge ring 430 is positioned adjacent to an annular surface located on the edge of the central top surface 402 of the pedestal 140, wherein the annular surface may be step down from the central top surface.

As previously introduced, the pedestal assembly 400C includes a ring adjuster subassembly that is configured for positioning the edge ring (e.g., vertical placement and tilt) with respect to the central top surface 402 of the pedestal 140. The edge ring positioning allows for recipe controlled tuning of the relative capacitances between RF flow paths at one or more points along the outer edge of the wafer in order to optimize the edge deposition profile of the wafer disposed on the central top surface 402 of the pedestal 140. As shown, an edge undersurface of the edge ring 430 contacts a plurality of ring adjuster pins 445 connected to the adjuster plate 440 at locations that are adjacent to and outside a diameter of pedestal 140. The adjuster pins 445 extend vertically from the adjuster plate 440. For example, edge ring 430 is contacted by ring adjuster pin 445b, as illustrated in FIG. 4C.

Two distinct RF flow paths are present when the pedestal assembly 400C is under operation (e.g., processing a wafer). Imagining a wafer that is disposed on the central top surface 402 of the pedestal 140 and undergoing processing, one RF flow path 470b is through the wafer, and a second RF flow path 470a is through the edge ring 430 such as near the edge of the wafer.

In particular, the RF flow path 470b through the wafer (not shown) is described as follows. RF power originates at a source (e.g., showerhead 150), goes through a wafer (not shown but generally down towards the central top surface 402 of the pedestal 140), through a small air gap between the wafer and the central top surface 402 of the pedestal 140, and grounds to the pedestal 140. FIG. 4C-2 illustrates the total capacitance of the RF flow path 470b through a wafer to the pedestal 140, in accordance with one embodiment of the present disclosure. The wafer capacitance (e.g., $C_{wafer}$) and the air capacitance (e.g., $C_{air}$) are both constant and coupled in series with ground.

Capacitance is defined in equation (1) below, where C is the capacitance (in farads); A is the area of overlap of the two plates (in square meters); $\varepsilon_r$ is the relative static permittivity (sometimes called the dielectric constant) of the material between the plates (e.g., for a vacuum, $\varepsilon_r$=1); $\varepsilon_0$ is the electric constant (e.g., $\varepsilon_0 \approx 8.854 \times 10^{-12}$ F·m$^{-1}$); and d is the separation between the plates (in meters).

$$C = \varepsilon_r \varepsilon_0 \frac{A}{d} \tag{1}$$

The RF flow path 470a through the edge (e.g., carrier/focus) ring 430 is described as follows. RF power originates at a source (e.g., showerhead 150), goes through the edge ring 430, through a small air gap between edge ring 430 and pedestal, and grounds to the pedestal. With DSC a carrier ring lift (CRL) or edge ring lift mechanism is implemented to adjust the air gap between the edge ring 430 and the pedestal 140, for example at three points (or any variable of points). Since the capacitance of air is roughly 1/10 (one tenth) that of silicon (e.g., wafer) or alumina (e.g., edge ring) a very small change in the air gap will make a very large change in the capacitance of the RF path 470a through the edge ring 430. The ability to adjust the relative capacitance between the two paths 470a and 470b dynamically allows for tuning the deposition edge profile, which is highly dependent on other film properties that may greatly vary between customer wafer types. The tuning of the capacitances of the two RF flow paths reduces the radial non-uniformity of the deposition profile. Further, the ability to lift the edge ring 430 at three or more points independently (e.g., tilt) also allows correction of any azimuthal asymmetries which show up near the edge. FIG. 4C-1 illustrates the total capacitance of the RF flow path 470a through an edge ring to the pedestal, in accordance with one embodiment of the present disclosure. The edge ring capacitance (e.g., $C_{ring}$) and the air capacitance (e.g., $C_{air}$) are coupled in series with ground. The edge ring capacitance is constant. On the other hand, in embodiments of the present disclosure, the air capacitance (e.g., $C_{air}$) is tunable by adjusting the elevation and tilt of one or more points along the periphery of the edge ring relative to the central top surface 402 of the pedestal 140.

Without tuning of the positioning of the edge ring (e.g., placing the edge ring on the annular surface 410 of the pedestal 140), the interfacing between the outer edge of the wafer and the inner edge of the edge ring (e.g., through flow paths 470a and 47b) may create undesirable electrical discontinuities that may form voltage gradients affecting the plasma sheath. For example, an edge ring that is thin generally is associated with a deposition plating profile that is thin in the center and heavy at the edge of the wafer (see line 471). Also, an edge ring that is thick generally is associated with an opposing deposition plating profile that is thick in the center and thinner at the edge of the wafer (see line 472). On the other hand, tuning provides for a more uniform deposition profile, especially at the edge of the wafer, as is shown by line 475.

Figure 5A:
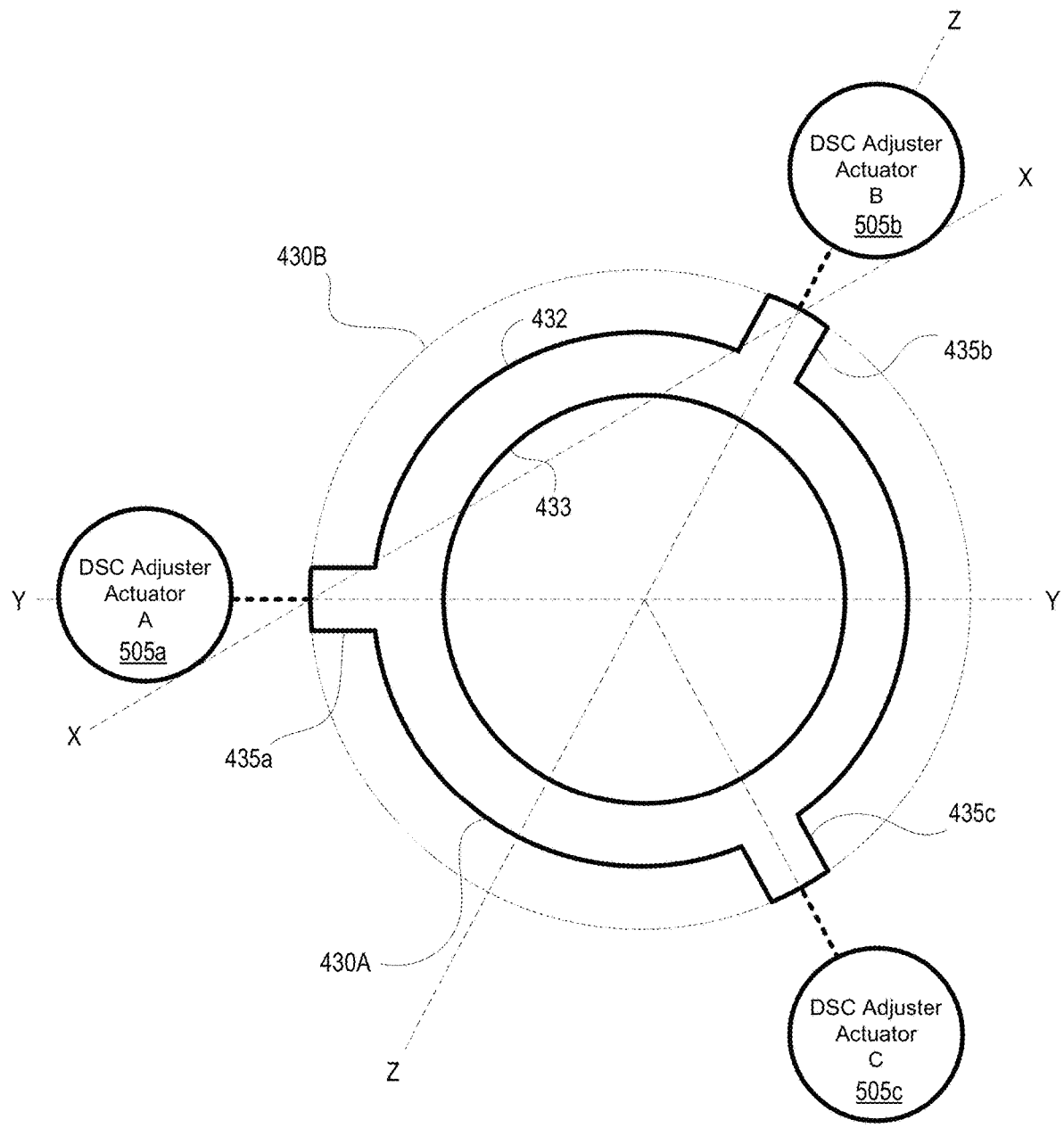
FIG. 5A illustrates a top view of a pedestal configuration including an edge ring that is a carrier ring and supporting dynamic sheath control including the independent vertical movement of contact sections of the carrier ring enabled through one or more adjuster actuators connected to one or more contact points in the contact sections, in accordance with one embodiment of the present disclosure.

FIG. 5A illustrates a top view of a pedestal assembly configuration (such as the pedestal assembly 400C of FIG. 4C) that is configured for recipe controlled tuning of the relative capacitances between RF flow paths at one or more points along the outer edge of the wafer in order to optimize the edge deposition profile of the wafer disposed on a pedestal, in accordance with one embodiment of the present disclosure. As shown, the pedestal assembly includes a carrier ring 430A that is supported on an annular surface configured at the periphery of the underlying pedestal. The carrier ring 430A includes an inner edge 433 that is positioned adjacent to the diameter of the central top surface 402 of the pedestal, and may lie just under the bottom of the edge of the wafer for purpose of lifting the wafer.

The carrier ring 430A also includes an outer edge 432 from which one or more tabs 4 or radial extensions radiate outwards (e.g., radially from a center of the carrier ring 430A). For example, carrier ring 430A includes three tabs 435a, 435b, and 435c. In one embodiment, the tabs are located equidistant from each other (e.g., equal radial distances) on a horizontal plane defined by the top surface of the carrier ring 430A. Each of the undersurfaces of the one or more tabs is aligned to contact a corresponding ring adjuster pin for lifting to implement dynamic sheath control (DSC). That is, each of the tabs extend out to a maximum diameter. The maximum diameter also corresponds to the outer diameter of a focus ring 430B (outlined with a dotted line). In particular, DSC is enabled through the independent vertical movement of contact points in contact sections (e.g., tabs) of the carrier ring 430A, as actuated by corresponding DSC adjuster actuators. For example, each of the ring adjuster pins are actuated (e.g., vertically moved) using a corresponding DSC adjuster actuator 505. For example, ring adjuster pin 445a (not shown) contacts tab 435a, and is actuated using DSC adjuster actuator A (505a). Also, ring adjuster pin 445b (not shown) contacts tab 435b, and is actuated using DSC adjuster actuator B (505b). In addition, ring adjuster pin 445c (not shown) contacts tab 435c, and is actuated using DSC adjuster actuator C (505c). As previously introduced, each of the ring adjuster pins 445 are connected to an adjuster plate at location that are adjacent to and outside a diameter of pedestal 140, wherein the adjuster pins 445 extend vertically from the adjuster plate 440. Actuation of the ring adjuster pins 445 is further described below in relation to FIGS. 5C, 6A, and 7Ats.

Figure 5B:
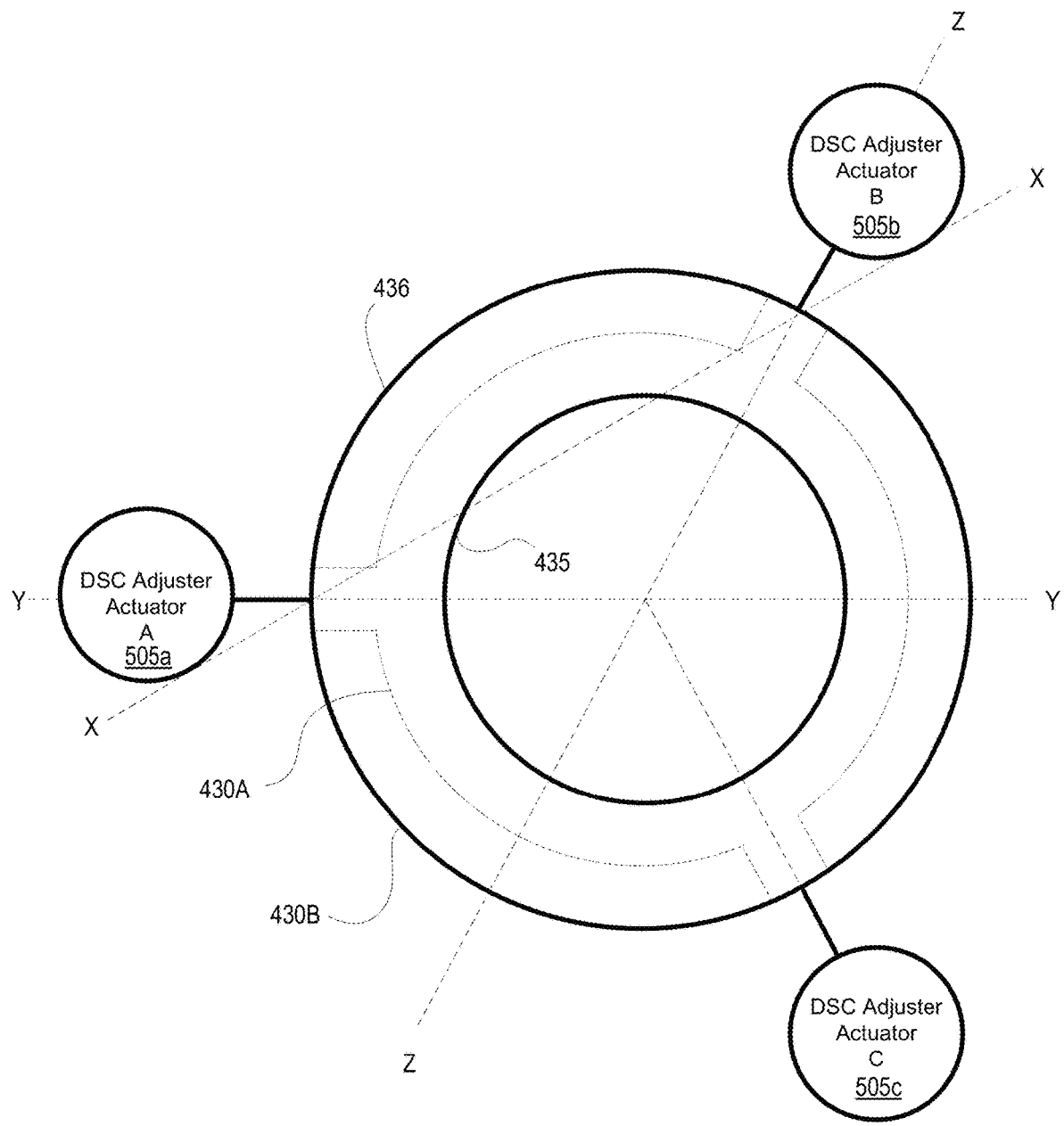
FIG. 5B illustrates a top view of a pedestal configuration including an edge ring that is a focus ring and supporting dynamic sheath control including the independent vertical movement of contact sections of the focus ring enabled through one or more adjuster actuators connected to one or more contact points in the contact sections, in accordance with one embodiment of the present disclosure.

FIG. 5B illustrates a top view of a pedestal assembly (such as the pedestal assembly 400C of FIG. 4C) that is configured for recipe controlled tuning of the relative capacitances between RF flow paths at one or more points along the outer edge of the wafer in order to optimize the edge deposition profile of the wafer disposed on a pedestal, in accordance with one embodiment of the present disclosure. As shown, the pedestal assembly includes a focus ring 430B that is supported on an annular surface configured at the periphery of the underlying pedestal. The focus ring 430B includes an inner edge 435 that is positioned adjacent to the diameter of the central top surface 402 of the pedestal, and may lie just under the bottom of the edge of the wafer to fill in any gap between the edge of the wafer and the annular surface in order to minimize plasma formation in the gap.

The focus ring 430B also includes an outer edge 436 that is radially uniform, and defines an outer diameter of the focus ring 430B. The outer edge 436 is configured such that the undersurface of the focus ring 430B at the edge contacts a corresponding ring adjuster pin for lifting to implement dynamic sheath control (DSC). The outer edge 436 or outer diameter also corresponds to the maximum diameter of the carrier ring (e.g., at the tabs), wherein the carrier ring 430A is shown in outline (e.g., dotted line). In particular, DSC is enabled through the independent vertical movement of contact points of the focus ring 430B, as actuated by corresponding DSC adjuster actuators. For example, each of the ring adjuster pins are actuated (e.g., vertically moved) using a corresponding DSC adjuster actuator 505. For example, ring adjuster pin 445a (not shown) contacts the undersurface of the periphery of the focus ring 430B, and is actuated using DSC adjuster actuator A (505a). Also, ring adjuster pin 445b (not shown) the undersurface of the periphery of the focus ring 430B, and is actuated using DSC adjuster actuator B (505b). In addition, ring adjuster pin 445c (not shown) contacts the undersurface of the periphery of the focus ring 430B, and is actuated using DSC adjuster actuator C (505c). As previously introduced, each of the ring adjuster pins 445 are connected to an adjuster plate at location that are adjacent to and outside a diameter of pedestal 140, wherein the adjuster pins 445 extend vertically from the adjuster plate 440. Actuation of the ring adjuster pins 445 is further described below in relation to FIGS. 5C, 6A, and 7A.

FIG. 5C illustrates a cutaway view roughly taken along lines X-X of FIG. 5A or 5B of a pedestal assembly (e.g., pedestal assembly 400C of FIG. 4C) that is configured with dynamic sheath control to lift radial portions of the carrier ring to modulate the relative capacitances of RF flow paths through a wafer or an edge ring (e.g., carrier ring, focus ring, etc.), in accordance with one embodiment of the present disclosure.

The pedestal assembly includes a pedestal 140 for supporting a substrate (e.g., wafer) (not shown). Pedestal 140 is shown having two segments 140a and 140b, for purposes of illustration only. For example, pedestal 140 may be formed in two segments to accommodate for formation during manufacturing a plurality of heating and/or cooling elements implemented through channels 480. As previously disclosed, it is appreciated that pedestal 140 is considered to be one element. While the pedestal 140 may be described as generally having a circular shape when viewed from above, the footprint of the pedestal 140 may vary from a circle to accommodate for different features, such as a carrier ring support, focus ring, and end-effector access, etc.

In one embodiment, the pedestal 140 includes a central top surface 402 extending from a central axis 420 of the pedestal to a central top surface diameter 422. One or more wafer supports 404 (e.g., MCAs) may be defined on the central top surface 402, and are configured for supporting a substrate (e.g., wafer) at a level above the central top surface 402. In addition, an annular surface 410 extends from the central top surface diameter 422 to an outer diameter 424 of the annular surface 410. In one embodiment, the annular surface 410 is configured at a step down from the central top surface 402. One or more edge ring supports 504 (e.g., MCAs) may be defined on the annular surface 410, and are configured to support an edge ring.

The pedestal 140 including a central shaft 510 that positions the pedestal at a height during operation. As shown, pedestal 140 is connected to a pedestal actuator 515, which is configured for controlling movement of the pedestal. In particular, central shaft 510 is coupled to the actuator 515 and the pedestal 140, such that the central shaft 510 extends between the actuator 515 and the pedestal 140. The central shaft 510 is configured to move the pedestal 140 along the central axis 420. As such, movement of the actuator 515 translates into vertical movement of the central shaft 510, which in turn translates into vertical movement of the pedestal 140.

A ring 430 is configured for placement along a periphery of the pedestal 140. The ring 430 is generically shown in FIG. 5C. In one embodiment, the ring 430 comprises a carrier ring 430A including a plurality of tabs extending to a maximum outer diameter of the carrier ring. In another embodiment, the ring 430 comprises a focus ring 430B, wherein the focus ring has a radially uniform outer diameter. The ring 430 is positioned adjacent to the annular surface 410 and extends beyond the diameter 149 of the pedestal 140 at least at a plurality of radial extensions of the ring. That is, the ring 430 may include one or more radial extensions in the case of a carrier ring (e.g., each tab or radial extension is in alignment with a corresponding ring adjuster pin), or may have a radially uniform diameter in the case of a focus ring, such that the maximum radial distance of the extensions of the carrier ring or the diameter of the focus ring extends beyond the diameter 149 of the pedestal 140 to allow contact with adjuster pins for purposes of lifting of the ring 430. As shown in FIG. 5C, the ring 430 is in contact with adjuster pin 445a and also in contact with adjuster pin 445b.

The pedestal assembly of FIG. 5C includes a ring adjuster subassembly that is configured for positioning the edge ring 430 (e.g., vertical placement and tilt) with respect to the central top surface 402 of the pedestal 140 (e.g., vertical placement and tilt). In that manner, recipe controlled tuning of the relative capacitances is enabled between RF flow paths (e.g., through the edge ring 430 or through the wafer) at one or more points along the outer edge of the wafer to optimize the wafer edge deposition profile. In particular, the ring adjuster subassembly includes an adjuster flange 542 that is disposed around the middle section of the central shaft 510. In addition, a sleeve 469 is connected to the adjuster flange 542, and extends from the adjuster flange 542 to an adjuster plate 440 that is disposed under the pedestal 140. In one embodiment, the sleeve 469 includes a funnel 460 that is connected to the adjuster plate 440. The sleeve 469 also includes a cylindrical portion 465 or sheath that is coupled to the adjuster flange 542. The cylindrical portion 465 is adjacent to the central shaft 510, but is configured for independent movement with respect to the central shaft. For example, the cylindrical portion and/or the sleeve 469 is configured to move with respect to and independent of the central shaft 510.

A plurality of ring adjuster pins 445 is connected to the adjuster plate 440. Each of the adjuster pins 445 extends vertically from the adjuster plate 440. In addition, each of the adjuster pins 445 is positioned on the adjuster plate 440 at a corresponding location that is adjacent to and outside of a diameter 149 of the pedestal 140. In that manner, each ring adjuster pin is configured for contacting an edge undersurface of the ring 430. As shown, ring adjuster pins 445a and 445b contact the edge undersurface of the ring 430 at locations that are adjacent to and outside the diameter of the pedestal. Similarly, a third ring adjuster pin 445c (not shown) may be configured to contact the edge undersurface of the ring 430.

The adjuster flange 542 is coupled to one or more adjuster actuators for defining an elevation and/or tilt of the ring 430 relative to the central top surface 402 of the pedestal 140. In one embodiment, the adjuster flange 542 is coupled to three adjuster actuators for defining an elevation and tilt of the ring 430 relative to the central top surface 402 of the pedestal 140. As shown, the adjuster flange 542 is connected and/or coupled to DSC adjuster actuator A (505a) for controlling the vertical movement of ring adjuster pin 445a, and DSC adjuster actuator B (505b) for controlling the vertical movement of ring adjuster pin 445b. Similarly, a third DSC adjuster actuator C (505c) (not shown) is connected and/or coupled to the adjuster flange, and is configured for controlling the vertical movement of ring adjuster pin 445c.

In particular, each of the adjuster actuators is connected to the adjuster flange 542 in alignment with contact points on the sleeve, and/or the cylindrical portion 465 or sheath of the sleeve. The contact points may be spaced radially equidistant from each other around a horizontal plane. Further, the contact points correspond to and/or are in alignment with the ring adjuster pins. Specifically, the adjuster plate 440 incudes a plurality of arms (e.g., radial extensions) that correspond to the contact points. For example, each arm is in alignment with a corresponding contact point. In addition, the plurality of ring adjuster pins are connected to ends of the plurality of arms at locations that are adjacent to and outside the diameter 149 of the pedestal 140. As a result, the contact points on the adjuster flange 542, the plurality of arms of the adjuster plate 440 and the plurality of adjuster pins 445 are in alignment.

As such, vertical movement of a corresponding contact point on the adjuster flange 542 (e.g., through a corresponding actuator interaction) is translated to a corresponding adjuster pin through the sleeve 469 and adjuster plate 440. For example, DSC adjuster actuator A (505a) actuates a corresponding contact point on the adjuster flange 542 to impart a vertical movement, which is also translated to the corresponding arm or radial extension of the adjuster plate 440 (e.g., through the cylindrical portion or sheath 465 and funnel 460), and which is translated to the corresponding adjuster pin 445a. Similarly, DSC adjuster actuator B (505b) actuates a corresponding contact point on the adjuster flange 542, which translated to a corresponding arm of the adjuster plate 440, and which is translated to the corresponding adjuster pin 445b. Also, DSC adjuster actuator C (505c) actuates a corresponding contact point on the adjuster flange 542, which translated to a corresponding arm of the adjuster plate 440, and which is translated to the corresponding adjuster pin 445c. In that manner, by tuning the position of ring 430 (e.g., vertical movement and tilt) with respect to the central top surface 402 of pedestal 140, this enables recipe controlled tuning of the relative capacitances between RF flow paths at one or more points along the outer edge of the wafer in order to optimize the edge deposition profile of the wafer disposed on the central top surface 402.

In addition, one or more hard stops 450 are located on the adjuster plate 440. The hard stops 450 are configured to limit the upward vertical movement of the adjuster plate 440 relative to the pedestal 140. In that manner, the vertical movement of the adjuster plate 440 may be limited to prevent damage to the pedestal 140, and/or to prevent contact of the ring 430 with the undersurface of the wafer.

Figures 1, 5D:
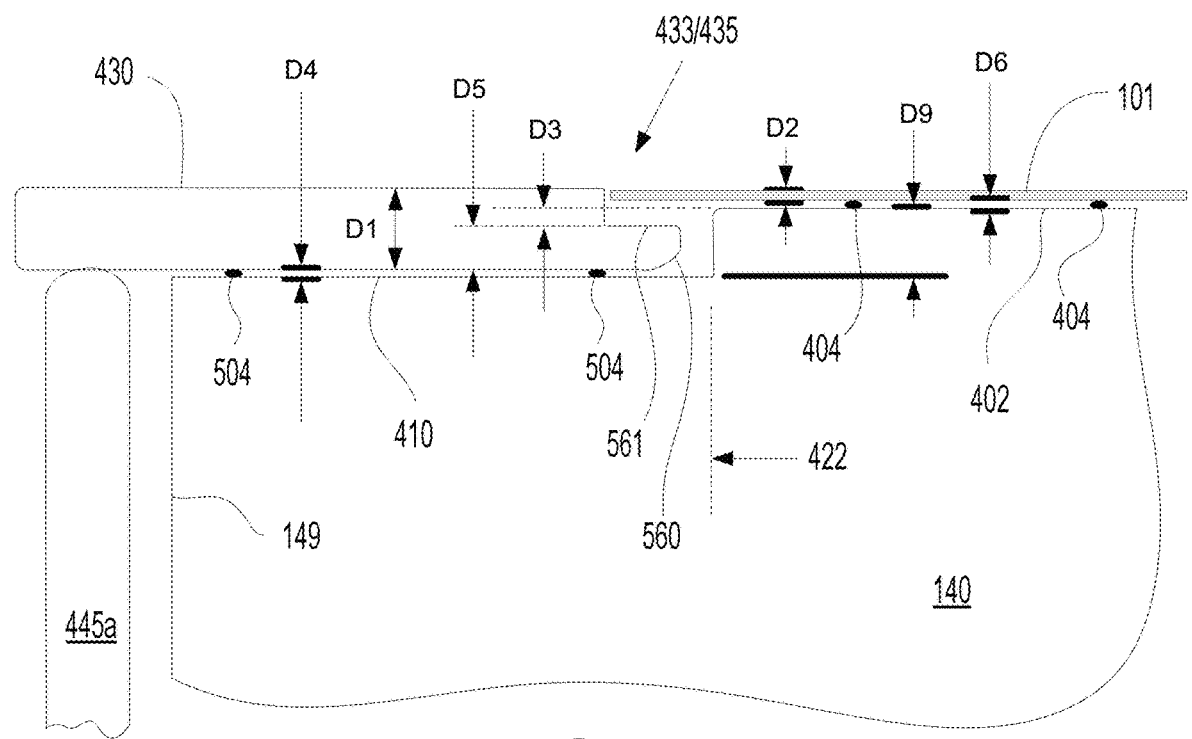
Figures 2, 5D:
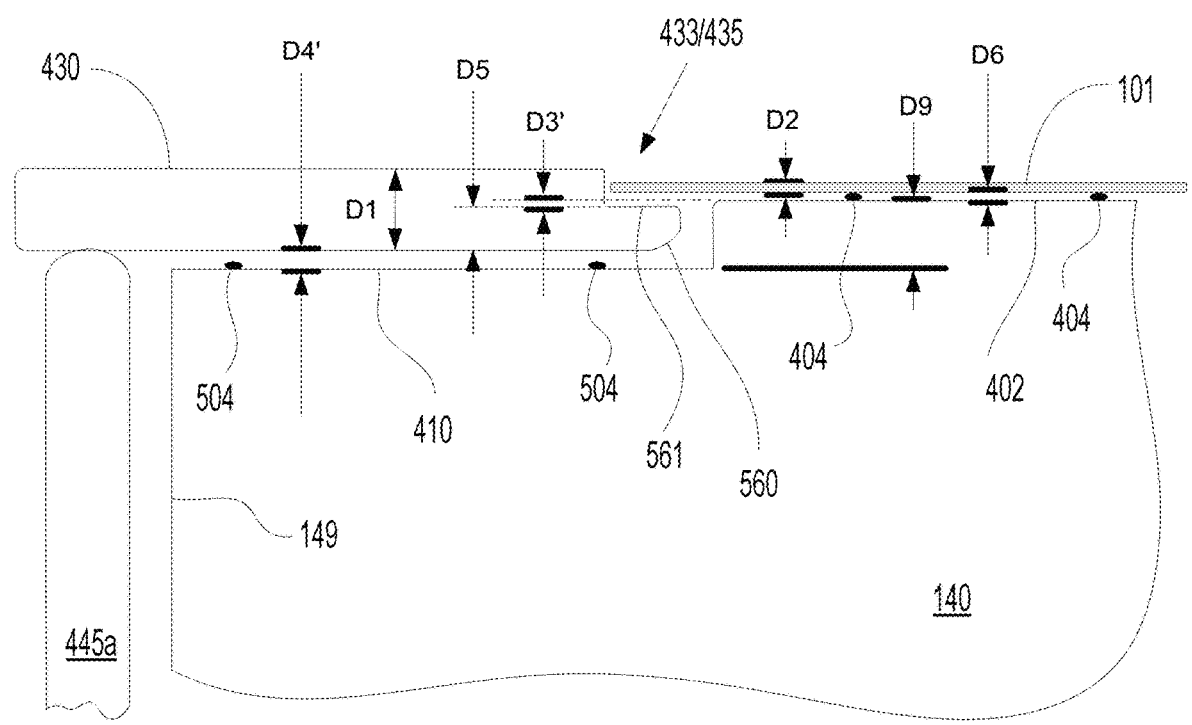
Figures 3, 5D:
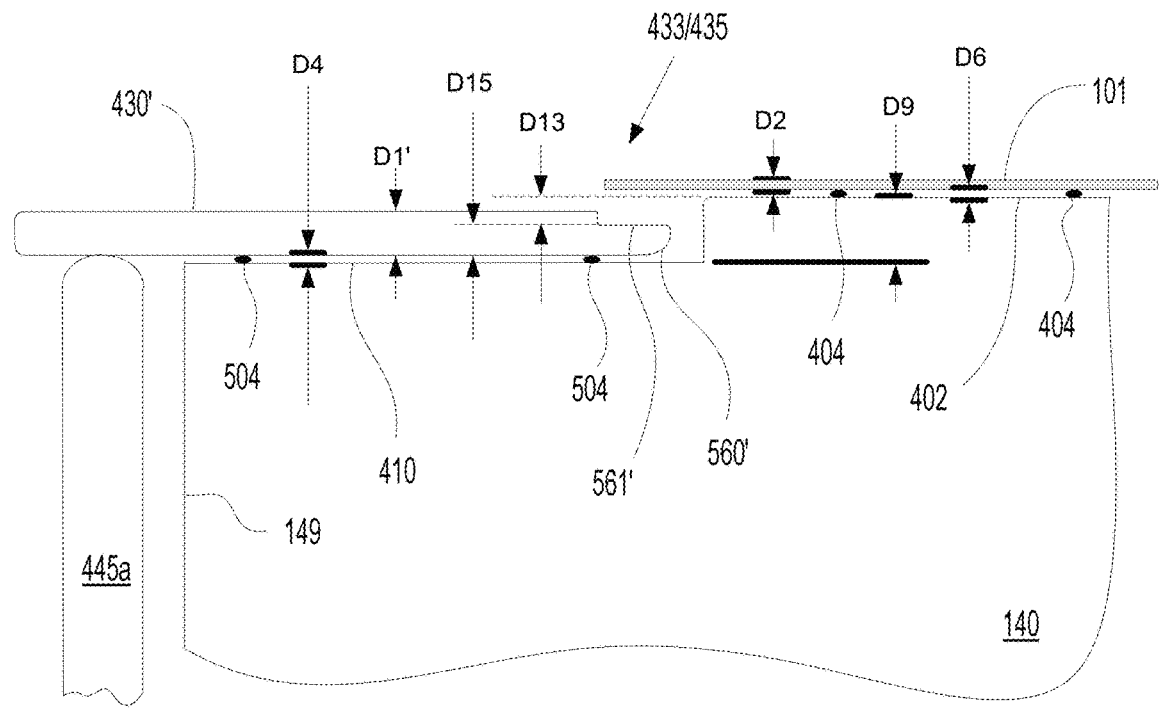

FIG. 5D-1 illustrates dimensions of a ring 430 (e.g., carrier ring, focus ring, etc.) configured for tuning the relative capacitances of RF flow paths through a wafer or the ring, in accordance with one embodiment of the present disclosure. In particular, FIG. 5D-1 shows in more detail the outer region 565 of the pedestal 140 and ring 430 of pedestal assembly shown in FIG. 5C. In particular, the pedestal assembly is configured for lifting of the ring 430 at one or more points to promote recipe controlled tuning of the relative capacitances between RF flow paths at one or more points along the outer edge of the wafer.

As shown, the pedestal assembly includes a pedestal 140 having a central top surface 402. The central top surface 402 may include one or more MCAs 404. The pedestal 140 includes an annular surface 410 that is located at a step down from the central top surface 402, such as by a distance D9.

A wafer 101 of thickness D2 is disposed by a wafer support level D6 over the central top surface 402 as implemented by MCAs 404.

The ring 430 is resting on the annular surface 410, such as on MCAs 504 or on ring supports 412 previously described. The ring 430 may be separated from the annular surface 410 by a distance D4, as implemented through MCAs or ring supports. Ring 430 has a traditional thickness D1. In addition, ring 430 includes an inner edge 433 (e.g., for carrier ring 430A) or 435 (e.g., for focus ring 430B). For purposes of illustration, the inner edge 433/435 of both the carrier ring 430A and focus ring 430B may be similarly configured to include a step 560 having a surface 561 that sits directly below an undersurface of a wafer 101 that is disposed on the central top surface 402. The thickness of the step 560 is shown as D5, and defines a separation D3 between the surface 561 of step 560 and the central top surface 402 which corresponds roughly to the undersurface of wafer 101. In embodiments of the present disclosure, thickness D5 of step 560 is thinner than in a normal ring, to provide for lifting of the ring 430 to provide tunability of the vertical separation and/or tilt of the ring 430 with respect to the central top surface 402.

Normally separation D3 goes near to zero to minimize the gap between the undersurface of the wafer and the annular surface 410 for purposes of minimizing plasma formation in the gap. However, distance D3 is increased to allow for DSC implementation, in one embodiment, and as is further shown in FIG. 5D-2, which shows the pedestal assembly as shown in FIG. 5D-1 in a lifted position. As shown, the ring 430 is raised from the annular surface 410, in accordance with one embodiment of the present disclosure. In particular, the ring 430 is raised at least by ring pin adjuster 445a such that the surface 561 of step 560 is approaching the underside of wafer 101. That is, the distance D3' between the surface 561 and the central top surface 402 is near zero. As such, the ring 430 is separated from the annular surface, such that it is not in contact with MCAs 504, nor is it in contact with annular surface 410. It is appreciated that ring 430 may be lifted to any height to modulate the distance D3, for example, as long as the ring (e.g., surface 561) is not touching the wafer 101.

FIG. 5D-3 illustrates dimensions of a thin ring 430' (e.g., carrier ring, focus ring, etc.) configured for tuning the relative capacitances of RF flow paths through a wafer 101 or the ring 430', wherein the carrier/focus ring is resting on an annular surface, in accordance with one embodiment of the present disclosure. In particular, FIG. 5D-3 shows in more detail the outer region 565 of the pedestal 140 and ring 430 of pedestal assembly shown in FIG. 5C. In particular, the pedestal assembly of FIG. 5D-3 is configured for lifting of the ring 430' at one or more points to promote recipe controlled tuning of the relative capacitances between RF flow paths at one or more points along the outer edge of the wafer. The pedestal assembly of FIG. 5D-3 is similar to the pedestal assembly of FIG. 5D-1, except that the thickness D1' of ring 430' is less than the thickness D1 of ring 430 of FIGS. 5D-1 and 5D-2. This provides for additional tuning of the relative capacitances between RF flow paths by selection of a ring of a particular thickness (e.g., swapping out rings to obtain the optimal thickness for the recipe and wafer type).

In particular, ring 430' of FIG. 5D-3 is shown resting on the annular surface 410, such as on MCAs 504 or on ring supports 412. The ring 430' may be separated from the annular surface 410 by a distance D4. The inner edge 433/435 of both the carrier ring 430A and focus ring 430B may be similarly configured to include a step 560' having a surface 561' that sits directly below an undersurface of a wafer 101 that is disposed on the central top surface 402. The thickness of the step 560' is shown as D15, and defines a separation D13 between the surface 561' of step 560' and the central top surface 402 which corresponds roughly to the undersurface of wafer 101. In embodiments of the present disclosure, thickness D15 of step 560' is thinner than in traditional rings to provide for lifting of the ring 430' to provide tunability of the vertical separation and/or tilt of the ring 430' with respect to the central top surface 402.

Figures 4, 5D:
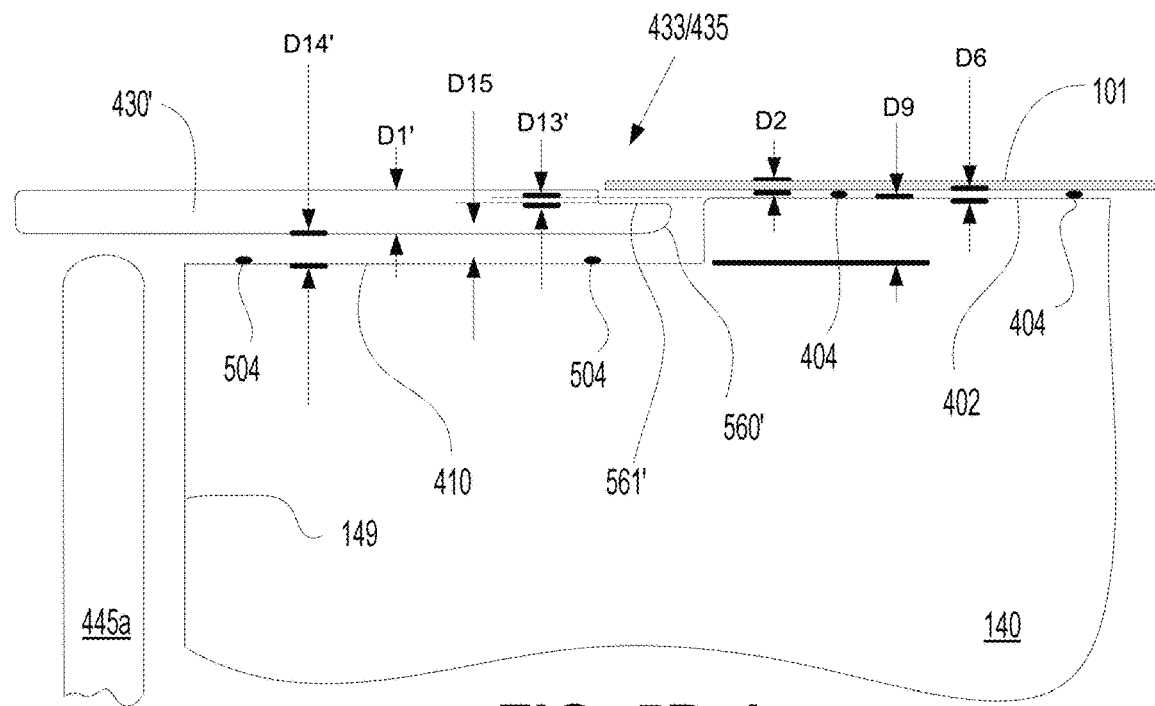

As previously described, normally separation D13 goes near to zero to minimize the gap between the undersurface of the wafer 101 and the annular surface 410 for purposes of minimizing plasma formation in the gap. However, distance D13 is increased to allow for DSC implementation, in one embodiment, and as is further shown in FIG. 5D-4, which shows the pedestal assembly as shown in FIG. 5D-3 in a lifted position. In particular, the ring 430' is raised from the annular surface 410, in accordance with one embodiment of the present disclosure. As shown, the ring 430 is raised at least by ring pin adjuster 445a such that the surface 561' of step 560' is approaching the underside of wafer 101. That is, the distance D13' between the surface 561' and the central top surface 402 is near zero. As such, the ring 430' is separated from the annular surface, such that it is not in contact with MCAs 504, nor is it in contact with annular surface 410. It is appreciated that ring 430' may be lifted to any height to modulate the distance D13, for example, as long as the ring (e.g., surface 561') is not touching the wafer 101.

Figure 6A:
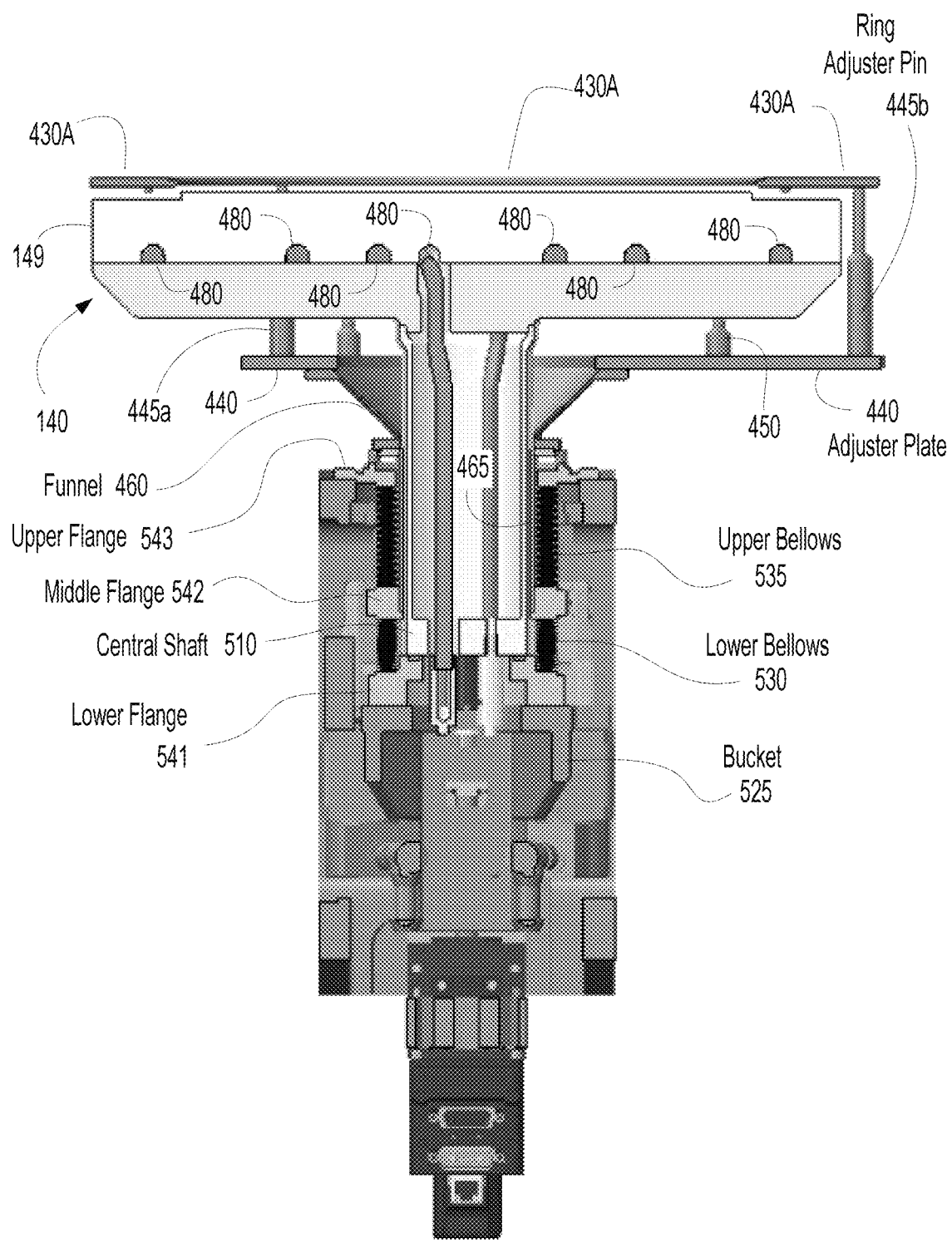
FIG. 6A illustrates a cutaway view of a pedestal assembly including dynamic sheath control to lift radial portions of a carrier ring to modulate the relative capacitances of RF flow paths through a wafer or the carrier ring, in accordance with one embodiment of the present disclosure.

FIG. 6A illustrates a cutaway view of a pedestal assembly including dynamic sheath control to lift radial portions of a carrier ring to modulate the relative capacitances of RF flow paths through a wafer or the carrier ring, in accordance with one embodiment of the present disclosure. The cutaway view may be taken along line Z-Z of FIG. 5A. The pedestal assembly is included within a substrate processing system, for example. The pedestal assembly of FIG. 6A may be implemented within the systems of FIGS. 1-3, including multi-station and single-station processing tools.

The pedestal assembly includes a pedestal 140 for supporting a substrate, wherein the pedestal 140 includes a central shaft 510 that positions the pedestal at a height during operation. The pedestal includes a central top surface, as previously described. A carrier ring 430A is configured for placement along a periphery of the pedestal 140. In particular, carrier ring 430A is supported over an annular surface of the pedestal 140, as previously described. The carrier ring 430A includes a plurality of tabs that extend to an outer diameter of the ring. In particular, the carrier ring 430A is positioned adjacent to the annular surface and extends beyond the diameter 149 of the pedestal 140 at least at a plurality of radial extensions of the ring 430A. For example, in the cutaway view taken along line Z-Z of FIG. 5A and shown in FIG. 6A, the carrier ring 430A extends to a maximum diameter (e.g., with radial arms or extensions), such as to contact the ring adjuster pin 445b that is beyond the diameter 149 of the pedestal 140. However, on the left side of FIG. 6A, the carrier ring 430A does not reach out to the maximum diameter, and only extends to outer edge 432 (see FIG. 5A), and as such does not extend beyond the diameter 149 of the pedestal 140.

The pedestal assembly includes a ring adjuster subassembly. The subassembly includes a lower flange 541 that is disposed around a lower section of the central shaft 510. The lower flange 541 is configured to maintain a vacuum within the central shaft. Lower flange 541 may be connected to a bucket 525 that is connected to a pedestal actuator, wherein bucket 525 and lower flange 541 maintain the vacuum within the central shaft 510. The subassembly also includes a lower bellows 530 connected to the lower flange 541. An adjuster flange 542 (e.g., middle flange) is connected to the lower bellows 530, and is disposed around a middle section of the central shaft 510. A sleeve is connected to the adjuster flange 542, and extends from the adjuster flange 542 to an adjuster plate 440 disposed under the pedestal 140. The sleeve includes a sheath or cylindrical portion 465 that is connected to the adjuster flange, and is adjacent to the central shaft 510. The sheath or cylindrical portion 465 can be moved independently from the central shaft 510 for purposes of DSC implementation, and also move with the central shaft when DSC is not implemented. The sleeve includes a funnel that is connected to the sheath or cylindrical portion 465 and to the adjuster plate 440. An upper bellows 535 is connected to the adjuster flange 542. An upper flange 543 is connected to the upper bellows 535. The flange, bellows, and sleeve configuration provide for movement of the adjuster plate during DSC implementation.

As previously described, a plurality of ring adjuster pins 445 is connected to the adjuster plate 440. Each of the adjuster pins 445 extends vertically from the adjuster plate 440. In addition, each of the adjuster pins 445 is positioned on the adjuster plate 440 at a corresponding location that is adjacent to and outside of a diameter 149 of the pedestal 140. In that manner, each ring adjuster pin is configured for contacting an edge undersurface of the carrier ring 430A. As shown, ring adjuster pin 445b contacts the edge undersurface of the carrier ring 430A at locations that are adjacent to and outside the diameter of the pedestal. Other ring adjuster pins may also contact the edge undersurface of the carrier ring 430A.

More particularly, the adjuster flange 542 is coupled to one or more adjuster actuators for defining an elevation and/or tilt of the carrier ring 430A relative to the central top surface 402 of the pedestal 140. In one embodiment, the adjuster flange 542 is coupled to three adjuster actuators for defining an elevation and tilt of the carrier ring 430A.

In particular, each of the adjuster actuators is connected to the adjuster flange 542 in alignment with contact points on the cylindrical portion 465 or sheath of the sleeve, that is further in alignment with the ring adjuster pins (e.g., through arms or radial extensions of the adjuster plate 440). As a result, the contact points on the adjuster flange 542, the plurality of arms of the adjuster plate 440 and the plurality of adjuster pins 445 are in alignment. In that manner, vertical movement of a corresponding contact point on the adjuster flange 542 (e.g., through a corresponding actuator interaction) is translated to a corresponding adjuster pin. For example, DSC adjuster actuator B (505b) actuates a corresponding contact point on the adjuster flange 542 to impart a vertical movement, which is also translated to the corresponding arm or radial extension of the adjuster plate 440 (e.g., through the cylindrical portion or sheath 465 and funnel 460), and which is translated to the corresponding adjuster pin 445b. Similar translation is achieved for movement of adjuster pins 445a and 445c. In that manner, by tuning the position of carrier ring 430A (e.g., elevation and tilt) with respect to the central top surface 402 of pedestal 140, this enables recipe controlled tuning of the relative capacitances between RF flow paths at one or more points along the outer edge of the wafer in order to optimize the edge deposition profile of the wafer disposed on the central top surface 402.

Figure 6B:
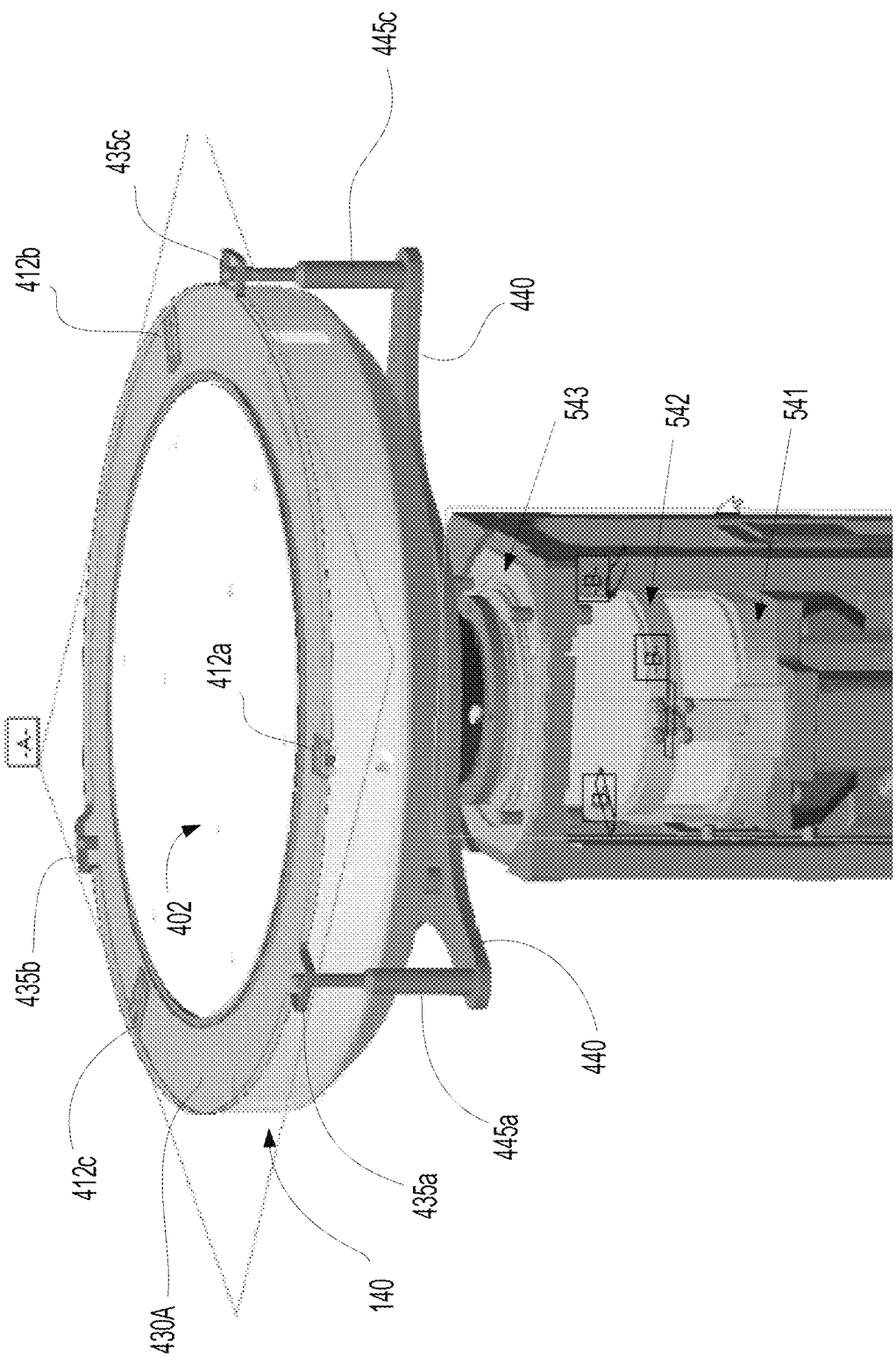
FIG. 6B illustrates an isometric view of a pedestal configuration including dynamic sheath control to lift radial portions of the carrier ring to modulate the relative capacitances of RF flow paths through a wafer or the carrier ring, in accordance with one embodiment of the present disclosure.

FIG. 6B illustrates an isometric view of the pedestal assembly shown in FIG. 6A, and includes dynamic sheath control to lift radial portions of the carrier ring 430A to modulate the relative capacitances of RF flow paths through a wafer (not shown) or the carrier ring 430A, in accordance with one embodiment of the present disclosure. In particular, carrier ring 430A includes tabs 435a, 435b, and 435c that extend out beyond the diameter 149 of the pedestal 140. In that manner, the tabs 435a, 435b, and 435c may come into contact with the ring adjuster pins 445a, 445b, and 445c, respectively. Ring supports 412a, 412b, and 412c are also shown engaging with the carrier ring 430A to prevent lateral movement of the ring.

Figure 6C:
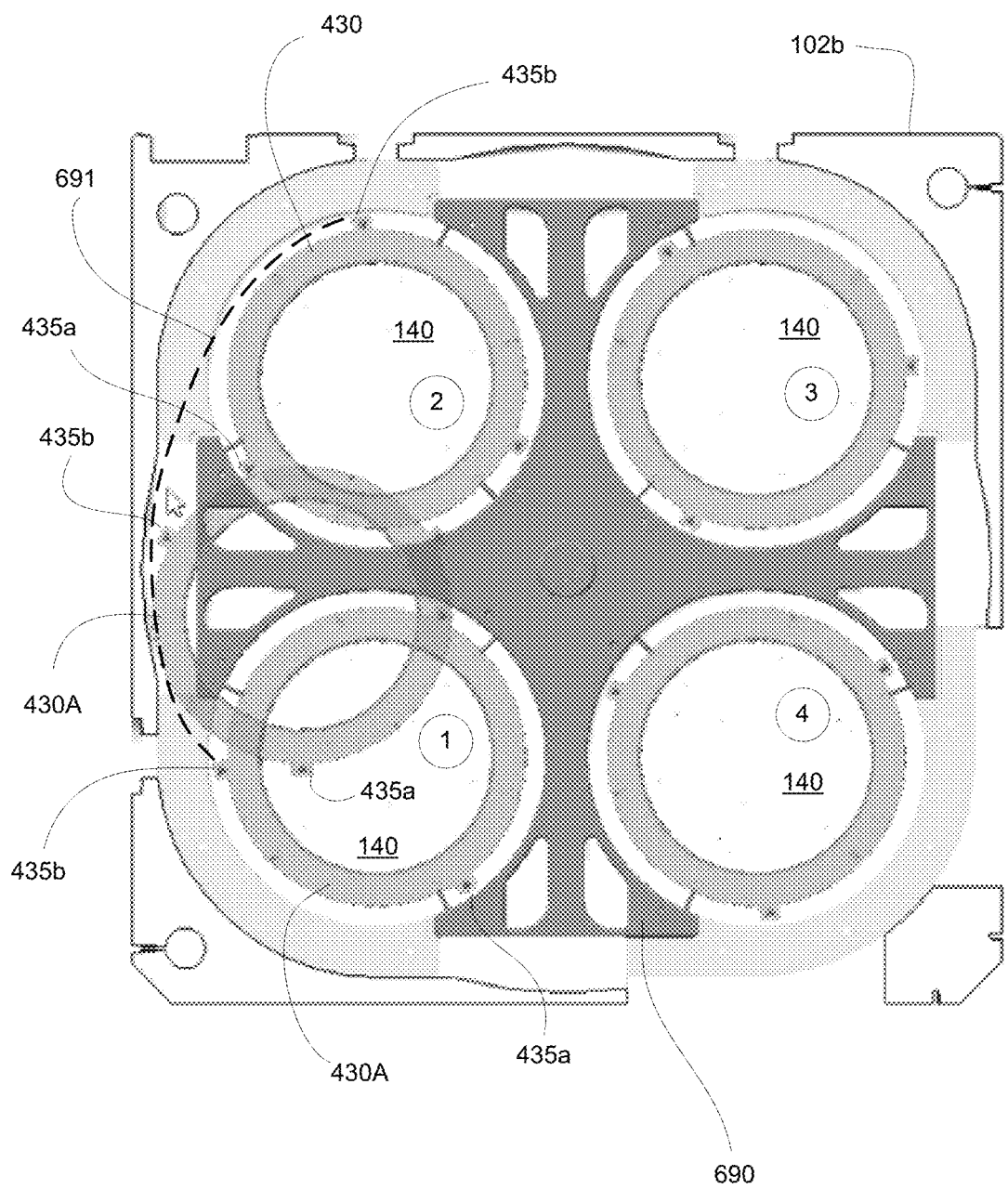
FIG. 6C illustrates a top view of a multi-station processing tool showing the positioning of the tabs or radial extensions of a carrier ring, such that the tabs do not interfere with the walls of the chamber when moving the carrier ring from station to station, in accordance with one embodiment of the present disclosure.

FIG. 6C illustrates a top view of a multi-station processing tool showing the positioning of the tabs or radial extensions of a carrier ring, such that the tabs do not interfere with the walls of the chamber when moving the carrier ring from station to station, in accordance with one embodiment of the present disclosure. The multi-station processing tool may be implemented within the substrate processing system 100 of FIG. 1, which includes a chamber 102 having at least a lower chamber portion 102b (shown in FIG. 6C), and an upper chamber portion. The multi-station processing tool may include four stations (e.g., stations 1-4), each similarly configured with a pedestal assembly, such as those previously described. For example, each pedestal assembly includes a pedestal 140, a carrier ring 430A, and a ring adjuster assembly. An indexing plate 690 is included in the multi-station processing tool. The indexing plate 690 is configured to raise up and lift the carrier rings 430A from the stations simultaneously, and then rotate at least one or more stations before lowering the edge rings 430A to a next location so that further plasma processing, treatment and/or film deposition can take place on respective wafers.

The carrier rings 430A are positioned within each station 1-4 such that when rotating the carrier rings, the tabs 435 on each carrier ring 430A do not contact the walls of the chamber (e.g., the walls of the lower chamber portion 102b). For example, carrier ring 430A is oriented within station 1 in such a manner such that the tabs 435a, 435b, or 435c do not contact the chamber walls during indexing. As shown, tab 435b of carrier ring 430A in station 1 follows approximately the arc 691, such that tab 435b does not make contact with the chamber walls when indexing a wafer and corresponding carrier ring 430A from station 1 to station 2.

Figure 7A:
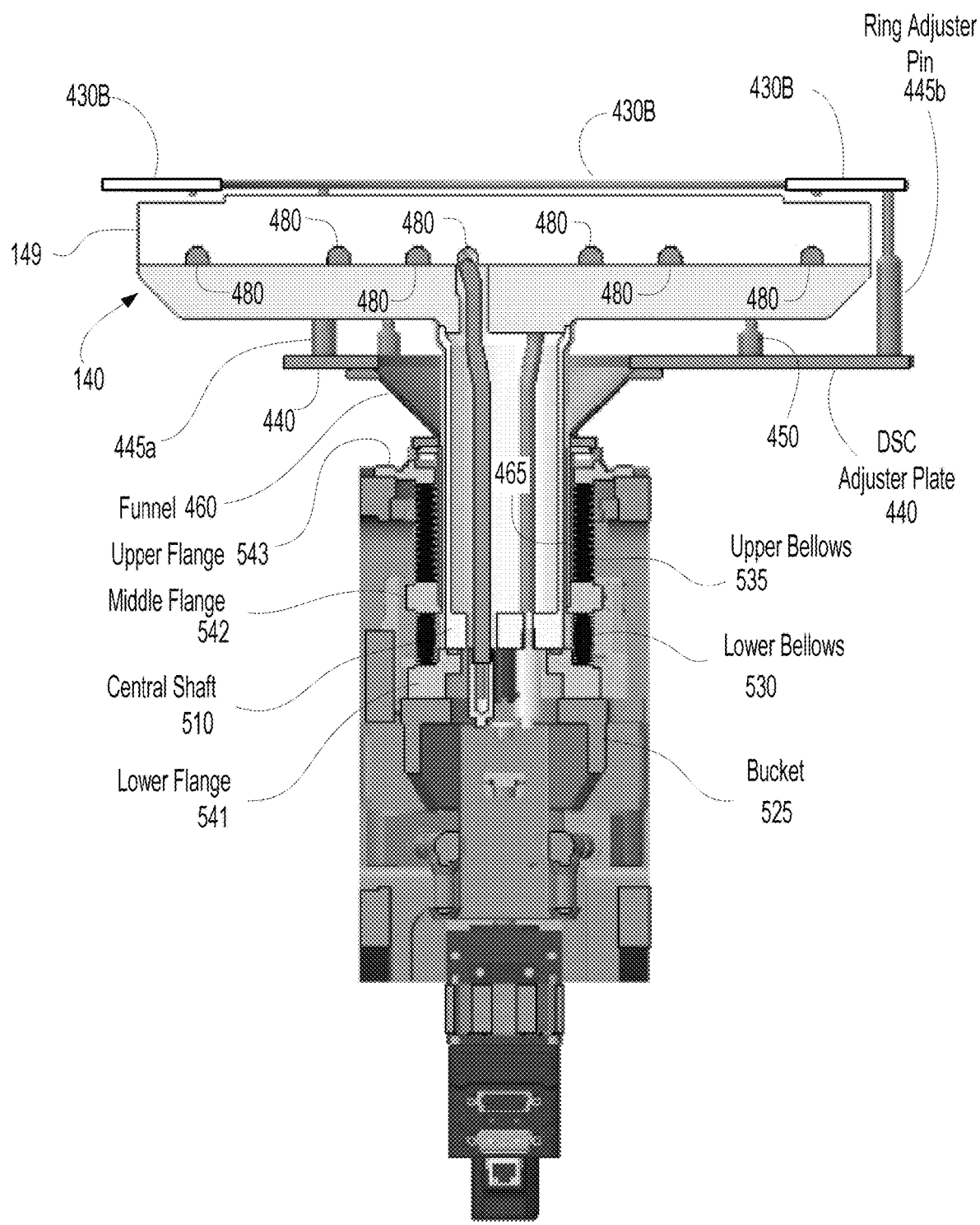
FIG. 7A illustrates a cutaway view of a pedestal configuration including dynamic sheath control to lift radial portions of a focus ring to modulate the relative capacitances of RF flow paths through a wafer or the focus ring, in accordance with one embodiment of the present disclosure.

FIG. 7A illustrates a cutaway view of a pedestal assembly including dynamic sheath control to lift radial portions of a focus ring to modulate the relative capacitances of RF flow paths through a wafer or the focus ring, in accordance with one embodiment of the present disclosure. The cutaway view may be taken along line Z-Z of FIG. 5B. The pedestal assembly is included within a substrate processing system, for example. The pedestal assembly of FIG. 7A may be implemented within the systems of FIGS. 1-3, including multi-station and single-station processing tools.

The pedestal assembly includes a pedestal 140 for supporting a substrate, wherein the pedestal 140 includes a central shaft 510 that positions the pedestal at a height during operation. The pedestal includes a central top surface, as previously described. A focus ring 430B is configured for placement along a periphery of the pedestal 140. In particular, focus ring 430B is supported over an annular surface of the pedestal 140, as previously described. The focus ring 430B has a radially uniform outer diameter. In particular, the focus ring 430B is positioned adjacent to the annular surface and extends beyond the diameter 149 of the pedestal 140. For example, in the cutaway view taken along line Z-Z of FIG. 5B and shown in FIG. 7A, the focus ring 430B extends to make contact the ring adjuster pin 445b that is beyond the diameter 149 of the pedestal 140. Because the focus ring 430B has a uniform outer diameter, on the left side of FIG. 7A, the focus ring 430B also reaches out beyond the diameter 149 of the pedestal, even though it may not be contacting a corresponding ring adjuster pin.

The pedestal assembly includes a ring adjuster subassembly. The subassembly includes a lower flange 541 that is disposed around a lower section of the central shaft 510. The lower flange 541 is configured to maintain a vacuum within the central shaft. Lower flange 541 may be connected to a bucket 525 that is connected to a pedestal actuator, wherein bucket 525 and lower flange 541 maintain the vacuum within the central shaft 510. The subassembly also includes a lower bellows 530 connected to the lower flange 541. An adjuster flange 542 (e.g., middle flange) is connected to the lower bellows 530, and is disposed around a middle section of the central shaft 510. A sleeve is connected to the adjuster flange 542, and extends from the adjuster flange 542 to an adjuster plate 440 disposed under the pedestal 140. The sleeve includes a sheath or cylindrical portion 465 that is connected to the adjuster flange, and is adjacent to the central shaft 510. The sheath or cylindrical portion 465 can be moved independently from the central shaft 510 for purposes of DSC implementation, and also move with the central shaft when DSC is not implemented. The sleeve includes a funnel that is connected to the sheath or cylindrical portion 465 and to the adjuster plate 440. An upper bellows 535 is connected to the adjuster flange 542. An upper flange 543 is connected to the upper bellows 535. The flange, bellows, and sleeve configuration provide for movement of the adjuster plate during DSC implementation.

As previously described, a plurality of ring adjuster pins 445 is connected to the adjuster plate 440. Each of the adjuster pins 445 extends vertically from the adjuster plate 440. In addition, each of the adjuster pins 445 is positioned on the adjuster plate 440 at a corresponding location that is adjacent to and outside of a diameter 149 of the pedestal 140. In that manner, each ring adjuster pin is configured for contacting an edge undersurface of the focus ring 430B. As shown, ring adjuster pin 445b contacts the edge undersurface of the focus ring 430B at a location that is adjacent to and outside the diameter of the pedestal 140. Other ring adjuster pins may also contact the edge undersurface of the focus ring 430B.

The adjuster flange 542 is coupled to one or more adjuster actuators for defining an elevation and/or tilt of the focus ring 430B relative to the central top surface 402 of the pedestal 140. In one embodiment, the adjuster flange 542 is coupled to three adjuster actuators for defining an elevation and tilt of the focus ring 430B. As previously described, each of the adjuster actuators is connected to the adjuster flange 542 in alignment with contact points on the cylindrical portion 465 or sheath of the sleeve, that is further in alignment with the ring adjuster pins (e.g., through arms or radial extensions of the adjuster plate 440). In that manner, vertical movement of a corresponding contact point on the adjuster flange 542 (e.g., through a corresponding actuator interaction) is translated to a corresponding adjuster pin. For example, DSC adjuster actuator B (505b) actuates a corresponding contact point on the adjuster flange 542 to impart a vertical movement, which is also translated to the corresponding arm or radial extension of the adjuster plate 440 (e.g., through the cylindrical portion or sheath 465 and funnel 460), and which is translated to the corresponding adjuster pin 445b. In that manner, by tuning the position of focus ring 430B (e.g., elevation and tilt) with respect to the central top surface 402 of pedestal 140, this enables recipe controlled tuning of the relative capacitances between RF flow paths at one or more points along the outer edge of the wafer in order to optimize the edge deposition profile of the wafer disposed on the central top surface 402.

Figure 7B:
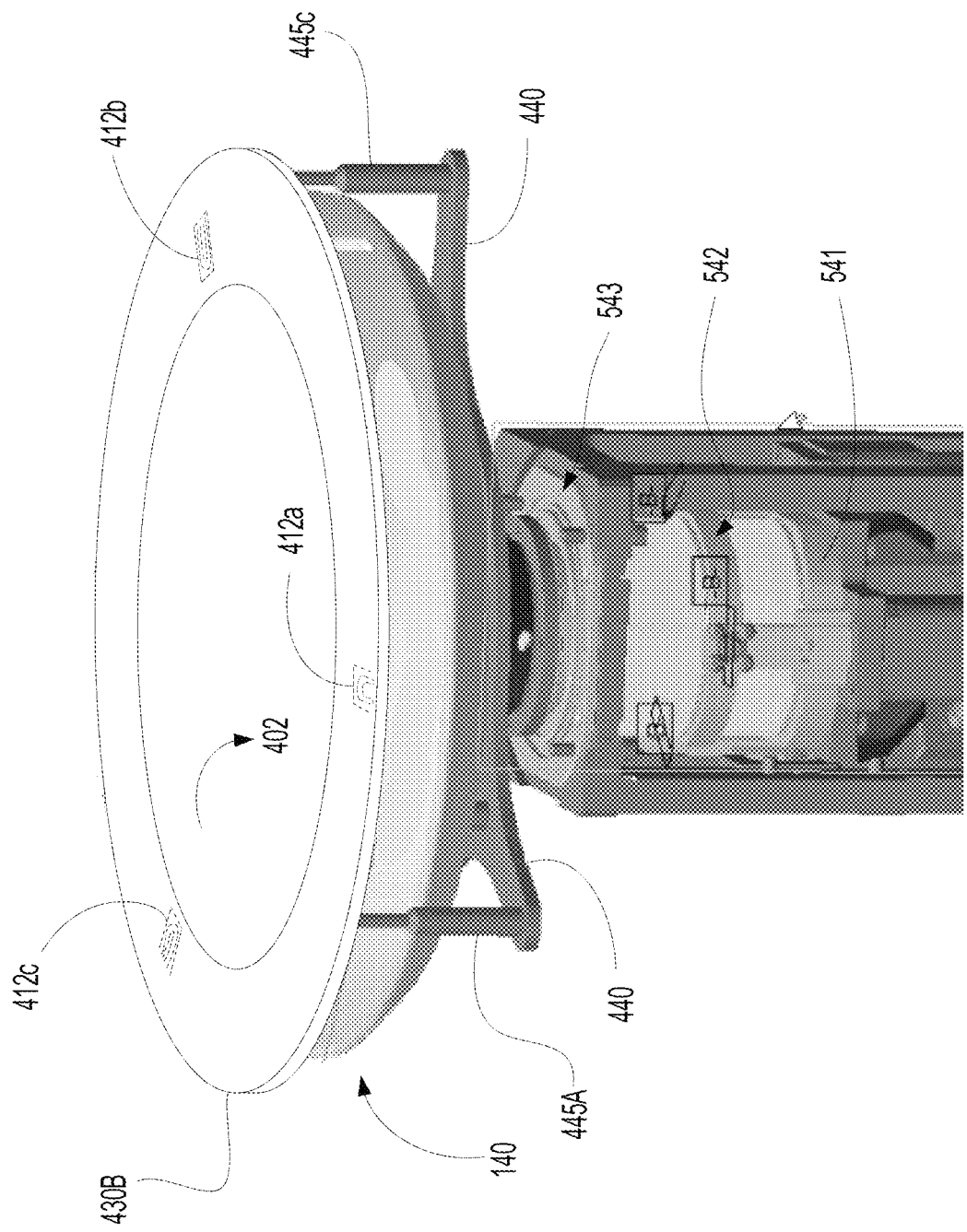
FIG. 7B illustrates an isometric view of a pedestal configuration including dynamic sheath control to lift radial portions of the focus ring to modulate the relative capacitances of RF flow paths through a wafer or the focus ring, in accordance with one embodiment of the present disclosure.

FIG. 7B illustrates an isometric view of a pedestal assembly shown in FIG. 7A, an includes a dynamic sheath control to lift radial portions of the focus ring 430B to modulate the relative capacitances of RF flow paths through a wafer or the focus ring, in accordance with one embodiment of the present disclosure.

In particular, focus ring 430B has a radially uniform outer diameter that extends out beyond the diameter 149 of the pedestal 140. In that manner, the periphery of the focus ring 430B may come into contact with the ring adjuster pins 445a, 445b, and 445c. Ring supports 412a, 412b, and 412c are also shown engaging with the focus ring 430B to prevent lateral movement of the ring.

Figure 8A:
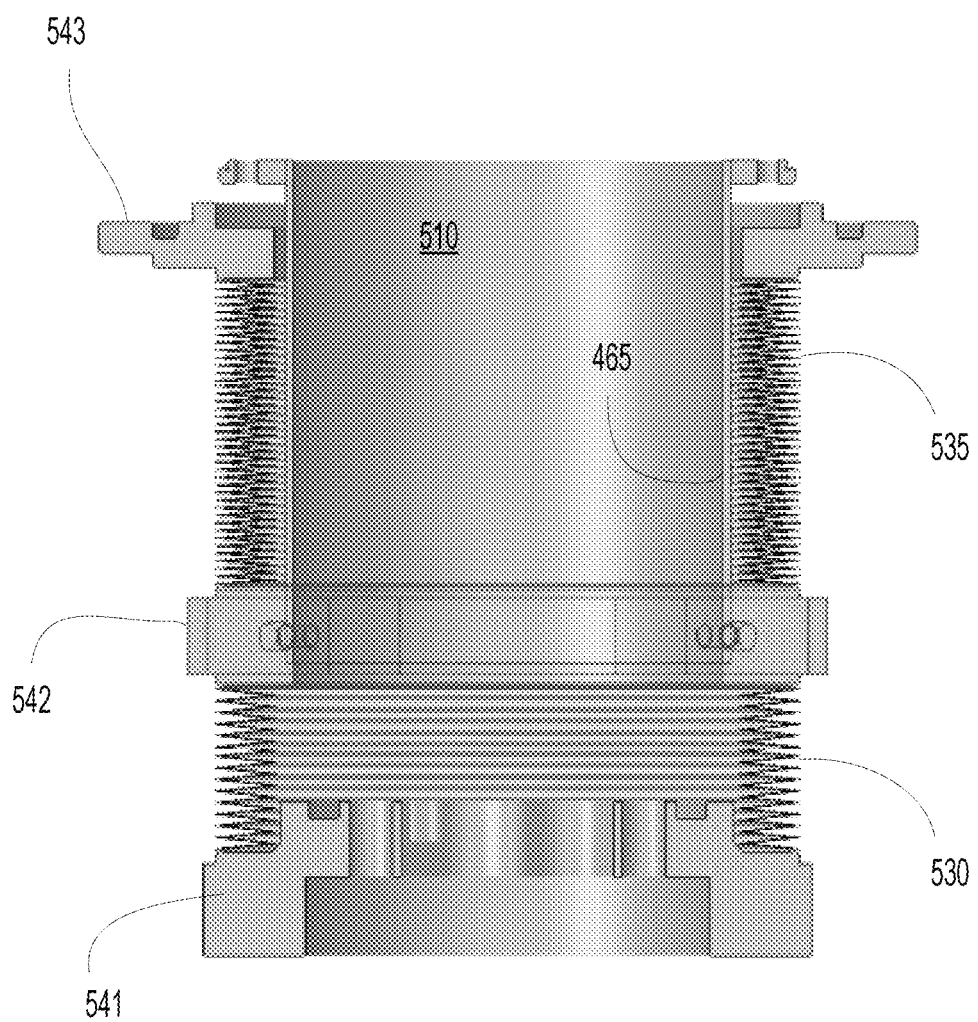
FIG. 8A illustrates a cross section of the interface between a central shaft of a pedestal and a sheath or sleeve configured for dynamic sheath control to lift radial portions of an edge (e.g., carrier or focus) ring to modulate the relative capacitances of RF flow paths through a wafer or the edge ring, in accordance with one embodiment of the present disclosure.
Figure 8B:
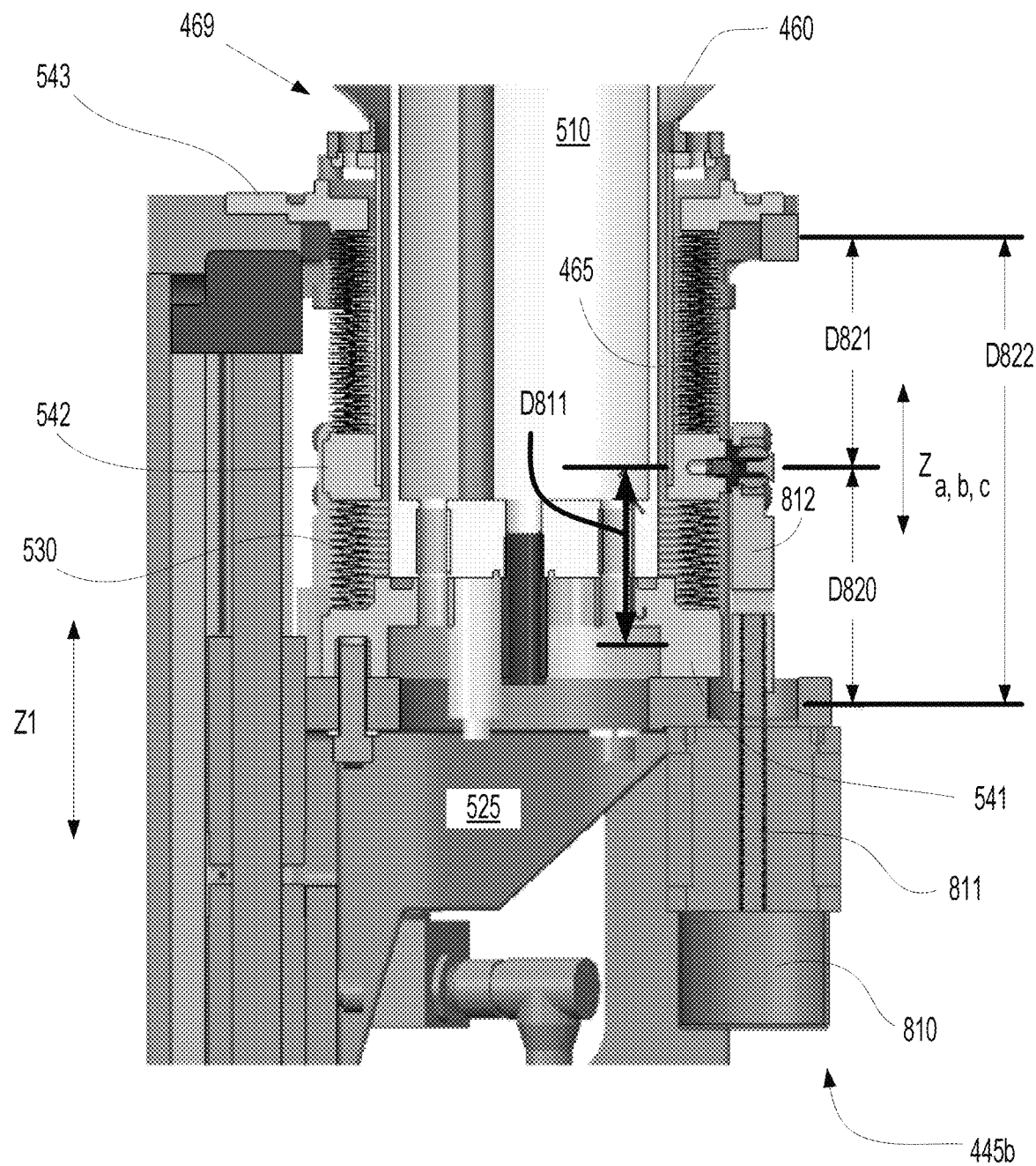
FIG. 8B illustrates the relative movement of the central shaft of a pedestal and a sheath or sleeve configured for dynamic sheath control to lift radial portions of an edge (e.g., carrier or focus) ring to modulate the relative capacitances of RF flow paths through a wafer or the edge ring, in accordance with one embodiment of the present disclosure.

FIGS. 8A-8B illustrates cross-sections of the interface between a central shaft 410 of a pedestal 140 and a sleeve 469 configured for dynamic sheath control to lift radial portions of an edge (e.g., carrier or focus) ring to modulate the relative capacitances of RF flow paths through a wafer or the edge ring (e.g., carrier ring, focus ring, etc.), in accordance with one embodiment of the present disclosure. The sleeve includes a funnel 460 and a sheath or cylindrical portion 465 surrounding the central shaft 510. A ring adjuster subassembly provides for independent movement of the sleeve 469 with respect to the central shaft 510 that is translated to movement of the edge ring (e.g., elevation and tilt with respect to the central top surface of the pedestal). In particular, portions of the ring adjuster subassembly are shown in FIGS. 8A-8B. The subassembly includes a lower flange 541 that is disposed around a lower section of the central shaft 510, and is further configured to maintain a vacuum within the central shaft of the pedestal 140. For example, the lower flange 541 is connected to the bucket 525 and/or interfaces of the bucket and forms an accessible seal around the lower section of the central shaft. Movement of the central shaft is provided through actuation of the bucket 525 which is connected to the lower flange 541. A lower bellows 530 is connected to the lower flange 541. An adjuster flange 542 is connected to the lower bellows 530, and is further disposed around a middle section of the central shaft 510. A sleeve includes a sheath or cylindrical portion 465 that is connected to the adjuster flange 542 at one end, and extends from the adjuster flange 542 to an adjuster plate (not shown) that is disposed under the pedestal (not shown) at the other end. An upper bellows 535 is connected to the adjuster flange 542 at one end, and at the opposite end to an upper flange 543.

The flange and bellows configuration of FIGS. 8A-8B maintains a vacuum within the central shaft 510, while also providing for actuation of the middle flange 542 and sheath or cylindrical portion 465 outside of the vacuum. More particularly, FIG. 8B illustrates the relative movement of the central shaft 510 of the pedestal 140 and the sheath or cylindrical portion 465 of the sleeve that are configured for dynamic sheath control to lift radial portions of an edge (e.g., carrier or focus) ring to modulate the relative capacitances of RF flow paths through a wafer or the edge ring, in accordance with one embodiment of the present disclosure. Independent movement of the sheath or cylindrical portion 465 with respect to the central shaft 510 may be described in relation to distances D811, D820, D821, and D822. In particular, D811 describes the distance between the lower flange 541 and the middle or adjuster flange 542. Also, D820 describes the distance between the bucket 525 and the middle or adjuster flange 542. D820 provides similar information as D811 as the bucket and lower flange 541 are fixed in relation to each other. Further, D821 describes the distance between the middle or adjuster flange 542 and the upper flange 543. In addition, D822 describes the distance between the bucket 525 and the upper flange 543.

In particular, as is shown in FIG. 8B, as the bucket 525 is moved in vertical fashion (e.g., Z1), the dimensions for D811 and D820 remain constant as corresponding components move with the bucket 525. That is, the relative distance D811 between the middle or adjuster flange 542 and the lower flange 541 remains constant. Also, because the lower flange 541 is fixed with relation to the bucket, the relative distance D820 between the middle or adjuster flange 542 and the bucket 525 remains constant (i.e., the lower bellows 530 is not expanded or contracted/compressed). This is because the actuator system including the motor 810 and ball screw assembly (including the ball screw 811 and block 812) is attached both to the bucket 525 and the middle or adjuster flange 542. As Z1 changes, as long as the actuator system is not enabled, the relative distances D811 and D820 remain constant. In one implementation, the distance D821 between the middle or adjuster flange 542 and the upper flange 543 would change as Z1 changes. Similarly, the distance D822 between the upper flange 543 and the lower flange 541 would be also be changed. For example, as the bucket 525 is moved vertically upwards in Z1, then the upper bellows would compress and D821 (and D822) would be reduced. The distances D811 and D820 remain constant. Similarly, as the bucket 525 is moved vertically downwards in Z1, then the upper bellows would expand and D821 (and D822) would be increased.

On the other hand, as the middle or adjuster flange 542 is actuated, the dimensions D811, D820, D821, and D822 may change. Actuation of the middle or adjuster flange 542 may be achieved through a motor 810 and ball screw assembly (e.g., ball screw 811, block 812, etc.), for example. The middle or adjuster flange 542 acts as an adjustable plane offset from the edge ring plane. Other actuation methods may be supported in other embodiments. In particular, as the ball screw is rotated, the block 812 is moved vertically up or down. The block 812 is fastened to one contact point or section of the middle or adjuster flange 542 using fastening hardware, for example. As such, the vertical movement of block 812 is translated to movement (e.g., vertical) of the contact point or section of the middle or adjuster flange 542. In that manner, the lower bellows 530 would expand or contract, such that the distances D811 and D820 would change, wherein D811 and D820 provide information about the relative distance between the middle or adjuster flange 542 and the lower flange 541. The distances D821 and D822 providing information about the relative distances between the upper flange 543, the middle or adjuster flange 542, and the lower flange 541 may change, or may remain constant.

Additional actuator systems may be implemented to provide vertical movement of various other contact points or sections of the middle or adjuster flange 542, as previously described. For example, a three contact point system may be implemented on the middle or adjuster flange 542 to implement dynamic sheath control which provides elevation and tilt to the edge ring with respect to a central top surface of a pedestal. In particular, DSC adjuster actuator A (505a) (e.g., including a motor and ball screw assembly) may be connected to a first contact point or section of the middle or adjuster flange 542. Also, DSC adjuster actuator B (505b) may be connected to a second contact point or section of the middle or adjuster flange 542. Further, DSC adjuster actuator C (505c) may be connected to a third contact point or section of the middle or adjuster flange 542. Each DSC adjuster actuator may be independently operated to provide independent movement of a corresponding contact point in the middle or adjuster flange 542. That is, a first constant point in the middle or adjuster flange 542 may be independently moved with respect to the other contact points. As such, one or more of the contact points may be moved to provide elevation and tilt of the sleeve 469 (e.g., sheath, or cylindrical portion 465 and funnel 460), which is translated to the adjuster plate 440, and to one or more of the ring adjuster pins, as previously described. In still another embodiment, instead of three actuator assemblies, one actuator assembly may be used with an opposing bearing guide (e.g., for cost reduction, space considerations, or simplification).

It is appreciated that the dual bellows system described at least in FIGS. 8A-8B to provide for dynamic sheath control may be implemented with one or more bellows to impart elevation and/or tilt to an edge ring (e.g., through appropriate connections with a sleeve, adjuster plate, adjuster pins, etc.).

In one embodiment, the actuator assembly and/or the ring adjuster subassembly includes a pressure controlled flexure welded into the pedestal, and a pressure manifold machined into the pedestal itself. Actuation distance would be a function of the flexure dimensions (e.g., inner diameter—ID, outer diameter—OD, stem OD, material thickness, material, etc.), the pressure input (relative to the chamber side (e.g., either approximately 0 psi or approximately 14.7 psi, depending on if it is at atmosphere or vacuum), and the temperature of the flexure (which affects its modulus of elasticity). Pressure would be the control variable In still another embodiment, the actuator assembly and/or the ring adjuster subassembly includes pressure controlled bellows welded into the pedestal with the pressure manifold machined into the pedestal itself. Actuation distance would be a function of the bellows dimensions or spring rate (convolution ID/OD, leaflet thickness, material), the pressure input (relative to the chamber side (e.g., either approximately 0 psi or 14.7 psi, depending on if it is at atmosphere or vacuum), and the temperature of the flexure which affects its modulus of elasticity. Pressure would be the control variable.

Figure 9:
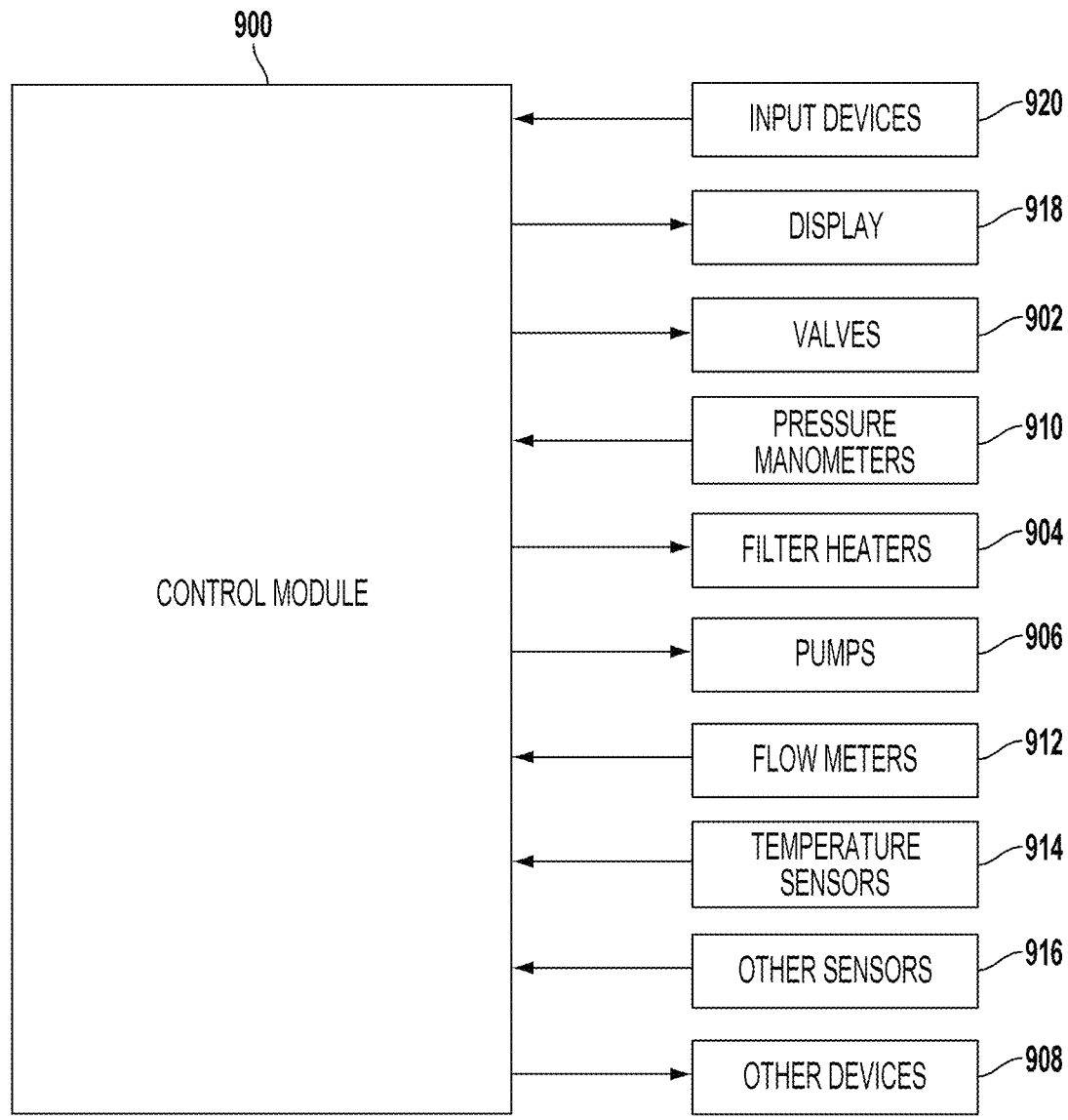
FIG. 9 shows a control module for controlling the systems described above.

FIG. 9 shows a control module 900 for controlling the systems described above. For instance, the control module 900 may include a processor, memory and one or more interfaces. The control module 900 may be employed to control devices in the system based in part on sensed values. For example only, the control module 900 may control one or more of valves 902, filter heaters 904, pumps 906, and other devices 908 based on the sensed values and other control parameters. The control module 900 receives the sensed values from, for example only, pressure manometers 910, flow meters 912, temperature sensors 914, and/or other sensors 916. The control module 900 may also be employed to control process conditions during precursor delivery and deposition of the film. The control module 900 will typically include one or more memory devices and one or more processors.

The control module 900 may control activities of the precursor delivery system and deposition apparatus. The control module 900 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, and other parameters of a particular process. The control module 900 may also monitor the pressure differential and automatically switch vapor precursor delivery from one or more paths to one or more other paths. Other computer programs stored on memory devices associated with the control module 900 may be employed in some embodiments.

Typically there will be a user interface associated with the control module 900. The user interface may include a display 918 (e.g., a display screen and/or graphical software displays of the apparatus and/or process conditions), and user input devices 920 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 910, and thermocouples located in delivery system, the pedestal or chuck, and state sensors. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A pedestal assembly comprising
a pedestal for supporting a substrate, the pedestal is supported by a central shaft that positions the pedestal at a height during operation;
a ring configured for placement along a periphery of the pedestal; and
a ring adjuster subassembly including,
an adjuster plate;
an adjuster flange disposed around a middle section of the central shaft;
a sleeve connected to the adjuster flange and extending from the adjuster flange to the adjuster plate disposed under the pedestal and surrounding the central shaft; and
a plurality of ring adjuster pins connected to the adjuster plate at a corresponding location that is adjacent to a diameter of the pedestal and the plurality of adjuster pins are oriented vertically upward from the adjuster plate and positioned outside of the diameter of the pedestal, wherein the plurality of ring adjuster pins is configured to contact an edge undersurface of the ring;
wherein the adjuster flange is coupled to at least three adjuster actuators controlled by one or more controllers configured to raise or lower a corresponding portion of the adjuster flange, and in combination, the adjuster flange, the at least three adjuster actuators, and the one or more controllers are arranged to cause the adjuster plate to tilt and correspondingly define an elevation or a tilt of the ring relative to a top surface of the pedestal in order to control capacitance between an inner edge of the ring and the pedestal.

2. The pedestal assembly of claim 1, wherein the sleeve includes:
a cylindrical portion connected to the adjuster flange; and
a funnel connected to the cylindrical portion and to the adjuster plate.

3. The pedestal assembly of claim 2, wherein the cylindrical portion is adjacent to the central shaft.

4. The pedestal assembly of claim 1, wherein the pedestal includes:
the top surface extending from a central axis of the pedestal to a top surface diameter; and
an annular surface extending from the top surface diameter to an outer diameter of the annular surface, the annular surface being at a step down from the top surface,
wherein the central shaft extends from the central axis to a shaft diameter, the central shaft configured for vertical movement which is translated to the pedestal,
wherein the ring is positioned adjacent to the annular surface and extends beyond the diameter of the pedestal at least at a plurality of radial extensions of the ring.

5. The pedestal assembly of claim 1, wherein the ring includes a carrier ring including a plurality of tabs extending to a maximum outer diameter of the carrier ring, each of the plurality of tabs in alignment with a corresponding ring adjuster pin.

6. The pad of claim 1, wherein the ring includes a focus ring having a uniform outer diameter.

7. The pedestal assembly of claim 1, wherein the at least three adjustor actuators are connected to the adjuster flange in alignment with contact points spaced radially equidistant from each other around a horizontal plane.

8. The pedestal assembly of claim 7,
wherein the adjuster plate includes a plurality of arms corresponding to the contact points,
wherein the plurality of ring adjuster pins is connected to ends of the plurality of arms.

9. The pedestal assembly of claim 7, wherein vertical movement of a corresponding contact point on the adjuster flange is translated to a corresponding adjuster pin through the sleeve and the adjuster plate.

10. The pedestal assembly of claim 1, further comprising:
a plurality of hard stops located on the adjuster plate and configured to limit upward vertical movement of the adjuster plate relative to the pedestal.

11. A pedestal assembly comprising:
a pedestal for supporting a substrate, the pedestal is supported by a central shaft that positions the pedestal at a height during operation;
a ring configured for placement along a periphery of the pedestal; and a ring adjuster subassembly including,
  a lower flange disposed around a lower section of the central shaft, and configured to maintain a vacuum within the central shaft;
  a lower bellows connected to the lower flange;
  an adjuster plate;
  an adjuster flange connected to the lower bellows and disposed around a middle section of the central shaft;
  a sleeve connected to the adjuster flange and extending from the adjuster flange to the adjuster plate disposed under the pedestal and surrounding the central shaft;
  an upper bellows connected to the adjuster flange;
  an upper flange connected to the upper bellows; and
  a plurality of ring adjuster pins connected to the adjuster plate at a corresponding location that is adjacent to a diameter of the pedestal and the plurality of adjuster pins are oriented vertically upward from the adjuster plate and positioned outside of the diameter of the pedestal, wherein the plurality of ring adjuster pins is configured to contact an edge undersurface of the ring;
  wherein the adjuster flange is coupled to at least three adjuster actuators controlled by one or more controllers configured to raise or lower a corresponding portion of the adjuster flange, and in combination, the adjuster flange, the at least three adjuster actuators, and the one or more controllers are arranged to cause the adjuster plate to tilt and correspondingly define an elevation or a tilt of the ring relative to a top surface of the pedestal in order to control capacitance between an inner edge of the ring and the pedestal.

12. The pedestal assembly of claim 11, wherein the sleeve includes:
  a cylindrical portion connected to the adjuster flange; and
  a funnel connected to the cylindrical portion and to the adjuster plate.

13. The pedestal assembly of claim 11, wherein the pedestal includes:
  the top surface extending from a central axis of the pedestal to a top surface diameter; and
  an annular surface extending from the top surface diameter to an outer diameter of the annular surface, the annular surface being at a step down from the top surface,
  wherein the central shaft extends from the central axis to a shaft diameter, the central shaft configured for vertical movement which is translated to the pedestal,
  wherein the ring is positioned adjacent to the annular surface and extends beyond the diameter of the pedestal at least at a plurality of radial extensions of the ring.

14. The pedestal assembly of claim 11, wherein the ring includes a carrier ring including a plurality of tabs extending to an outer diameter of the ring, each of the plurality of tabs in alignment with a corresponding ring adjuster pin.

15. The pedestal assembly of claim 11, wherein the ring includes a focus ring having a uniform outer diameter.

16. The pedestal assembly of claim 11, wherein the at least three adjustor actuators are connected to the adjuster flange in alignment with contact points of the adjuster flange, the contact points being spaced radially equidistant from each other around a horizontal plane.

17. A pedestal assembly comprising:
  a pedestal for supporting a substrate, the pedestal is supported by a central shaft that positions the pedestal at a height during operation;
  a ring configured for placement along a periphery of the pedestal and extending beyond an outer diameter of the pedestal at a plurality of arms; and
  a ring adjuster subassembly including,
    an adjuster plate;
    an adjuster flange disposed around a middle section of the central shaft;
    a sleeve connected to the adjuster flange and extending from the adjuster flange to the adjuster plate disposed under the pedestal and surrounding the central shaft, the sleeve configured for vertical movement relative to the central shaft at a plurality of contact points, the plurality of contact points aligned with the plurality of arms; and
    a plurality of ring adjuster pins connected to the adjuster plate at a corresponding location on a corresponding arm of the adjuster plate that is adjacent to the outer diameter of the pedestal and the plurality of adjuster pins are oriented vertically upward from the adjuster plate and positioned outside of the outer diameter of the pedestal, wherein the plurality of ring adjuster pins is configured to contact an edge undersurface of the ring;
  wherein the adjuster flange is coupled to at least three adjuster actuators in alignment with the plurality of contact points, the at least three adjuster actuators controlled by one or more controllers configured to raise or lower a corresponding portion of the adjuster flange, and in combination, the adjuster flange, the at least three adjuster actuators, and the one or more controllers are arranged to cause the adjuster plate to tilt and correspondingly define an elevation or a tilt of the ring relative to a top surface of the pedestal in order to control capacitance between an inner edge of the ring and the pedestal.

18. The pedestal assembly of claim 17, wherein the sleeve includes:
  a cylindrical portion connected to the adjuster flange; and
  a funnel connected to the cylinder portion and to the adjuster plate.

19. The pedestal assembly of claim 17, wherein the pedestal includes:
  the top surface extending from a central axis of the pedestal to a top surface diameter; and
  an annular surface extending from the top surface diameter to an outer diameter of the annular surface, the annular surface being at a step down from the top surface,
  wherein the central shaft extends from the central axis to a shaft diameter, the central shaft configured for vertical movement which is translated to the pedestal,
  wherein the ring is positioned adjacent to the annular surface and extends beyond the outer diameter of the pedestal at least at a plurality of radial extensions of the ring.

20. The pedestal assembly of claim 17, wherein the ring includes a carrier ring or a focus ring.

* * * * *